(12) United States Patent
Lee et al.

(10) Patent No.: US 7,203,084 B2
(45) Date of Patent: Apr. 10, 2007

(54) THREE-DIMENSIONAL MEMORY DEVICE WITH ECC CIRCUITRY

(75) Inventors: Thomas H. Lee, Cupertino, CA (US); Mark G. Johnson, Los Altos, CA (US)

(73) Assignee: SanDisk 3D LLC, Sunnyvale, CA (US)

( * ) Notice: Subject to any disclaimer, the term of this patent is extended or adjusted under 35 U.S.C. 154(b) by 86 days.

(21) Appl. No.: 10/840,815

(22) Filed: May 6, 2004

(65) Prior Publication Data
US 2004/0206982 A1 Oct. 21, 2004

Related U.S. Application Data

(63) Continuation of application No. 09/748,589, filed on Dec. 22, 2000, now abandoned, which is a continuation-in-part of application No. 09/662,953, filed on Sep. 15, 2000, now abandoned.

(51) Int. Cl.
*G11C 5/02* (2006.01)
*G11C 5/06* (2006.01)

(52) U.S. Cl. ............... 365/51; 365/63; 365/174; 711/101

(58) Field of Classification Search ............... None
See application file for complete search history.

(56) References Cited

U.S. PATENT DOCUMENTS

| | | |
|---|---|---|
| 4,646,266 A | 2/1987 | Ovshinsky et al. |
| 5,029,125 A | 7/1991 | Sciupac |
| 5,043,967 A | 8/1991 | Gregg et al. |
| 5,065,389 A | 11/1991 | Roth |
| 5,119,291 A | 6/1992 | Flannagan et al. |
| 5,313,425 A | 5/1994 | Lee et al. |
| 5,321,824 A | 6/1994 | Burke et al. |

(Continued)

FOREIGN PATENT DOCUMENTS

| | | |
|---|---|---|
| EP | 0 073 486 A2 | 3/1983 |
| EP | 1 017 100 A1 | 7/2000 |
| EP | 1 168 150 A1 | 2/2002 |
| WO | WO 99/14763 | 8/1998 |

OTHER PUBLICATIONS

"New Direct CD 2.5 Improves Speed and Reliability of Data Archiving Using CD-R/CD-RW," http://www.adaptec.com/worl...pany/pressrelease.html?prodkey=08051998, 2 pages, Aug. 5, 1998.

(Continued)

*Primary Examiner*—Gary Portka
(74) *Attorney, Agent, or Firm*—Brinks Hofer Gilson & Lione

(57) ABSTRACT

The preferred embodiments described herein provide a memory device and methods for use therewith. In one preferred embodiment, a method is presented for using a file system to dynamically respond to variability in an indicated minimum number of memory cells of first and second write-once memory devices. In another preferred embodiment, a method for overwriting data in a memory device is described in which an error code is disregarded after a destructive pattern is written. In yet another preferred embodiment, a method is presented in which, after a block of memory has been allocated for a file to be stored in a memory device, available lines in that block are determined. Another preferred embodiment relates to reserving at least one memory cell in a memory device for file structures or file system structures. A memory device is also provided in which file system structures of at least two file systems are stored in the same memory partition. Additionally, methods for permanently preventing modification of data stored in a memory device and for identifying memory cells storing data are disclosed.

13 Claims, 20 Drawing Sheets

U.S. PATENT DOCUMENTS

| | | | |
|---|---|---|---|
| 5,432,729 | A | 7/1995 | Carson et al. |
| 5,437,028 | A | 7/1995 | Iijima |
| 5,448,728 | A | 9/1995 | Takano et al. |
| 5,469,450 | A | 11/1995 | Cho et al. |
| 5,469,451 | A | 11/1995 | Henmi |
| 5,559,732 | A | 9/1996 | Birge |
| 5,559,778 | A | 9/1996 | Inokuchi et al. |
| 5,708,667 | A | 1/1998 | Hayashi |
| 5,761,741 | A | 6/1998 | Robbins et al. |
| 5,784,391 | A | 7/1998 | Konigsburg |
| 5,796,694 | A | 8/1998 | Shirane |
| 5,835,396 | A | 11/1998 | Zhang |
| 5,835,509 | A | 11/1998 | Sako et al. |
| 5,890,169 | A | 3/1999 | Wong et al. |
| 5,915,167 | A | 6/1999 | Leedy |
| 5,943,254 | A | 8/1999 | Bakeman, Jr. et al. |
| 6,000,023 | A | 12/1999 | Jeon |
| 6,016,269 | A | 1/2000 | Peterson et al. |
| 6,034,882 | A | 3/2000 | Johnson et al. |
| 6,052,816 | A | 4/2000 | Yoshinogawa |
| 6,108,236 | A | 8/2000 | Barnett |
| 6,185,122 | B1 | 2/2001 | Johnson et al. |
| 6,208,545 | B1 | 3/2001 | Leedy |
| 6,216,247 | B1 | 4/2001 | Creta et al. |
| 6,226,241 | B1 | 5/2001 | D'Amato et al. |
| 6,236,587 | B1 | 5/2001 | Gudesen et al. |
| 6,282,605 | B1 | 8/2001 | Moore |
| 6,321,358 | B1 | 11/2001 | Anderson |
| 6,321,360 | B1 | 11/2001 | Takeuchi et al. |
| 6,336,175 | B1 | 1/2002 | Shaath et al. |
| 6,377,526 | B1 | 4/2002 | Vining et al. |
| 6,446,073 | B1 | 9/2002 | D'Amato et al. |
| 6,446,177 | B1 | 9/2002 | Tanaka et al. |
| 6,480,463 | B2 | 11/2002 | Hunter et al. |
| 6,530,009 | B1 | 3/2003 | James |
| 6,545,891 | B1 | 4/2003 | Tringali et al. |
| 2002/0034105 | A1 | 3/2002 | Kulkarni et al. |

OTHER PUBLICATIONS

"Universal Disk Format (UDF) Driver," http://www.trylinux.com/projects/udf/index.html, 3 pages (1999).

"FAT File Allocation Table," http://www.easydesksoftware.com/fat.htm, 2 pages, Oct. 24, 1999.

"FAT File Allocation Table," http://www.oreilly.com/reference/directory/terms/F/File_Allocation_Table.htm, 4 pages (1996).

"ISO9960 Simplified for DOS/Windows by Philip J. Erdelsky," http://www.alumni.caltech.edu/~pje/iso9660.html, 8 pages Aug. 26, 2000.

"Memory cards: designing with a full deck," http://www.ednmag.com/ednmag/reg/2000/052520000/11dfl.htm, 12 pages, May 25, 2000.

"DOS Disk Formats," http://www.qvctc.commnet.edu/classes/csc277/formats.html, 7 pages (1999).

"MS-DOS Partitioning Summary," http://www.qvctc.commnet.edu/classes/csc277/fdisk2.html, 3 pages (1999).

"DOS Partitions," http://www.qvctc.commnet.edu/classes/csc277/partitions.html, 5 pages (1999).

"DOS Disk Structures-Definitions," http://www.qvctc.commnet.edu/classes/csc277/formats2.html, 3 pages (1999).

"MS-DOS Summary A Survival Guide," http://www.washtenaw.cc.mi.us/dept/cis/mod/q02cd.htm, 10 pages (1996).

"Hardware White Paper, FAT: General Overview of On-Disk Format," Microsoft Corp., 25 pages, May 5, 1999.

"Method for Deleting Stored Digital Data from Write-Once Memory Device," U.S. Appl. No. 09/638,439, filed Aug. 14, 2000; inventors: Christopher S. Moore, Derek J. Bosch, Daniel C. Steere, and J. James Tringali.

"Method for Storing Digital Information in Write-Once Memory Array," U.S. Appl. No. 09/727,229, filed Nov. 30, 2000; inventors: David R. Friedman Derek J. Bosch, Christopher S. Moore, J. James Tringali, and Michael A. Vyyoda.

"Three-Dimensional Memory Array and Method of Fabrication," U.S. Appl. No. 09/560,626, filed Apr. 28, 2000; inventor: Johan Knall.

"Write-Once Memory Array Controller, System, and Method," U.S. Appl. No. 09/638,427, filed Aug. 14, 2000; inventors: Derek J. Bosch, Christopher S. Moore, Daniel C. Steere, and J. James Tringali.

"Low-Cost Three-Dimensional Memory Array," U.S. Appl. No. 09/638,428, filed Aug 14, 2000; inventors: Mark G. Johnson, Thomas H. Lee, Vivek Subramanian, and P. Michael Farmwald.

"Modular Memory Device," U.S. Appl. No. 09/638,334, filed Aug. 14, 2000; inventors: J. James Tringali, P. Michael Farmwald, Thomas H. Lee, Mark G. Johnson, and Derek J. Bosch.

"The MS-DOS Filesystem," http://www.cs.adfa.oz.au/teaching/studinfo/osrts/Lectures/node113.html, 2 pages Mar. 1, 2001.

"Computer Engineering: Hardware Design," M. Morris Mano, Chapter 6-4 Error Detection and Correction, pp. 199-202 (1988).

"Symantec The Norton Desktop User's Guide," Chapter 16 "Using Shredder," 8 pages (1993).

"Reed-Solomon Codes," http://www.4i2i.com/reed_solomon_codes.htm, 8 pages (1998).

"Linux System Administration—White Papers," Kirch et al., pp. 291-292 (1996).

"Undocumented DOS Second Edition—A Programmer's Guide to Reserved MS-DOS® Functions and Data Structures," Schulman et al., pp. 408-413 (1994).

"Universal Serial Bus Specification—Revision 2.0," pp. 287-289 (Apr. 27, 2000).

"UNIX chmod command," http://www.psc.edu/general/unix/chmod.html, 1 page (Nov. 13, 1999).

"Universal Disk Format® Specification—Revision 2.01," Optical Storage Technology Association, p. 25 (Mar. 15, 2000).

"Jack St. Clair Kilby," Jones Telecommunications & Multimedia Encyclopedia, http://www.digitalcentury.com/_encyclo/update/kilby.html, 4 pages (1999).

"The 'Chip' Inventors (part 1)," Dan Murray, http://www.livingstonmontana.com/access/dan/150thechipinventors-1.html, 3 pages (1999).

T. R. Reid, "The Chip: How Two Americans Invented the Microchip and Launched a Revolution," pp. 22-23 (1984).

"About Jack" http://www.ti.com/corp/docs/kilbyctr/jackbuilt.shtml, 6 pages (2002).

"Definition: integrated circuit," http://www.its.bldrdoc.gov/fs-1037/dir-019/_2755.htm, 1 page (1996).

Meindl, "Definitions of Terms for Integrated Electronics," IEEE Journal of Solid-State Circuits, p. 2 (Mar. 1967).

Muller et al., "Device Electronics for Integrated Circuits," second edition, pp. 65 and 106 (1986).

NN8803151, IBM Technical Disclosure Bulletin, "Incremental Directory Indexes for Write-Once Media", Mar. 1988, vol. 30, Issue 10, pp. 151-155.

"3D-ROM—A First Practical Step Towards 3D-IC," Zhang, 7 pages, Jul. 2000.

"Construction Techniques for Systematic SEC-DED Codes with Single Byte Error Detection and Partial Correction Capability for Computer Memory Systems," Penzo et al., IEEE Transactions on Information Theory, vol. 41, No. 2, Mar. 1995, pp. 584-591.

Microsoft Press Computer Dictionary, Second Edition, 1993, p. 73.

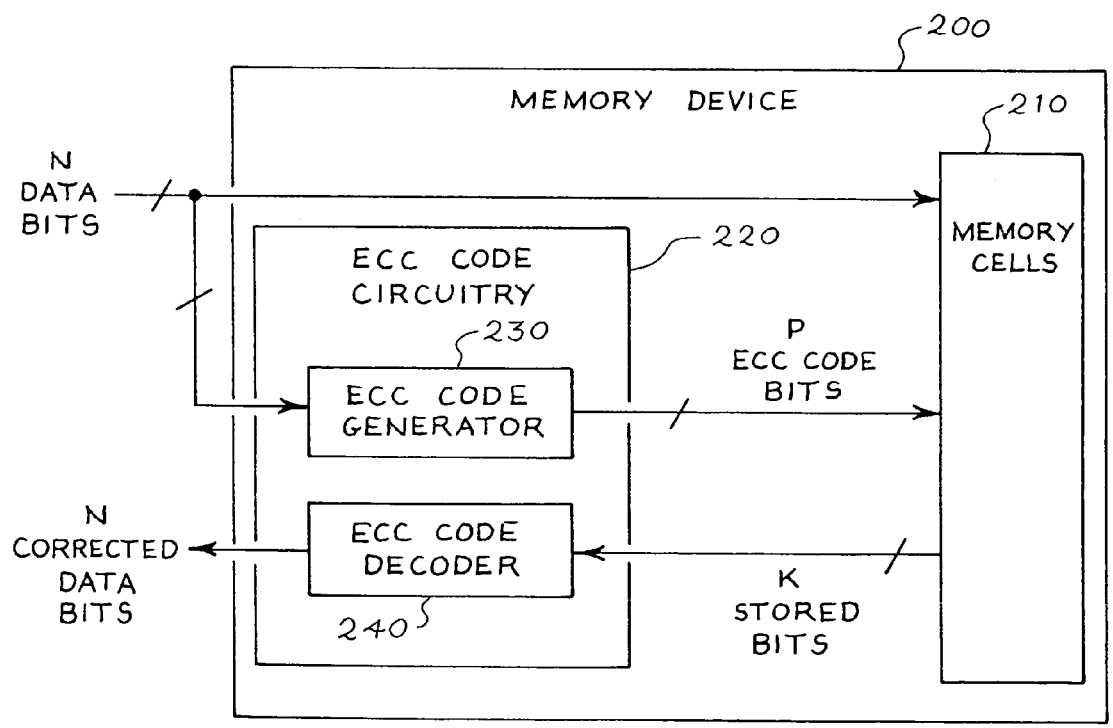

THREE-DIMENSIONAL MEMORY DEVICE WITH ECC CIRCUITRY

CROSS-REFERENCE TO RELATED APPLICATIONS

This application is a continuation of U.S. patent application Ser. No. 09/748,589, filed Dec. 22, 2000 (pending), which is a continuation-in-part of U.S. patent application Ser. No. 09/662,953, filed Sep. 15, 2000 (abandoned), each of which is incorporated by reference herein.

BACKGROUND

Non-volatile memory is becoming standard in many data storage systems such as digital cameras and digital audio players. Modular, portable memory devices, such as flash memory devices, are available that can be readily connected to and disconnected from these systems. CD-based media is also used. Regardless of the type of memory device employed, data storage systems use a file system to control where data is located on the device and to interface with the device. Many data storage systems use the DOS FAT file system. Because the DOS FAT file system requires that the memory device be re-writeable, the DOS FAT file system is not preferred for write-once memory devices. While there are file systems designed for write-once memory devices, such as the ISO9660 file system used by CD-ROMs and the Universal Disk Format (UDF) used by Adaptec for multi-session CD-RWs, these file systems may not be suitable for certain applications.

SUMMARY

The present invention is defined by the following claims, and nothing in this section should be taken as a limitation on those claims.

By way of introduction, the preferred embodiments described below provide memory devices and methods for use therewith. In one preferred embodiment, a method is presented for using a file system to dynamically respond to variability in an indicated minimum number of memory cells of first and second write-once memory devices. In another preferred embodiment, a method for overwriting data in a memory device is described in which an error code is disregarded after a destructive pattern is written. In yet another preferred embodiment, a method is presented in which, after a block of memory has been allocated for a file to be stored in a memory device, available lines in that block are determined. Another preferred embodiment relates to reserving at least one memory cell in a memory device for file structures or file system structures. A memory device is also provided in which file system structures of at least two file systems are stored in the same memory partition. Additionally, methods for permanently preventing modification of data stored in a memory device and for identifying memory cells storing data are disclosed.

It should be noted that the following preferred embodiments can be practiced with any suitable memory device and that the following claims should not be read as requiring a write-once memory device or a three-dimensional write-once memory device unless specifically recited. It should also be noted that any or all of the following embodiments can be used alone or in combination.

The preferred embodiments will now be described with reference to the attached drawings.

BRIEF DESCRIPTION OF THE DRAWINGS

FIGS. 10a, 10b, and 10c are schematic diagrams of a plurality of memory cells illustrating a method of identifying memory cells storing data of a preferred embodiment.

FIG. 11 is an illustration of a memory device of a preferred embodiment having embedded error checking and correcting (ECC) code circuitry.

FIG. 14A is a cross-sectional elevation view of an antifuse and semiconductor layer formed during the fabrication of the invented array.

FIG. 14B illustrates the structure of FIG. 14A after an additional semiconductor layer has been formed.

FIG. 14C illustrates the structure of FIG. 14B after a conductive layer is formed.

FIG. 14D illustrates the structure of FIG. 14C after an additional semiconductor layer has been formed.

FIG. 14E illustrates the structure of FIG. 14D after a masking and etching step.

FIG. 14F illustrates the structure of FIG. 14E after open spaces left from the etching step have been filled.

FIG. 14G illustrates the structure of FIG. 14F after a planarization step.

FIG. 14H illustrates the structure of FIG. 14G after another antifuse layer is formed.

DETAILED DESCRIPTION OF THE PRESENTLY PREFERRED EMBODIMENTS

Introduction

Figure 1:
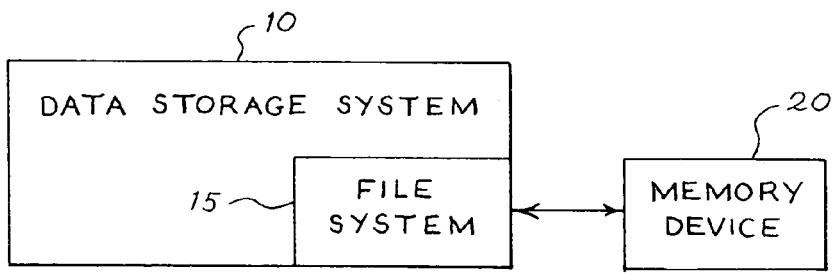
FIG. 1 is a block diagram of a data storage system and memory device of a preferred embodiment.

Turning now to the drawings, FIG. 1 shows a data storage system 10 coupled with a memory device 20. The data storage system 10 comprises a file system 15 operative to read and write data from/to the memory device 20. A data storage system can take any suitable form and may, for example, be implemented as a digital camera, a digital audio player, a personal digital assistant, a game player, a cellular telephone, an electronic book, or a general-purpose programmable computer. The memory device can also take any suitable form and, in one presently preferred embodiment, takes the form of a three-dimensional write-once memory device. Suitable three-dimensional write-once memory devices are described in U.S. Pat. No. 6,034,882, U.S. patent application Ser. No. 09/560,626 (abandoned), and U.S. patent application Ser. No. 09/638,428 (abandoned), all of which are assigned to the assignee of the present invention and are hereby incorporated by reference. Further details regarding alternative structures for the memory device are presented in U.S. patent applications Ser. Nos. 09/638,427 (pending) and 09/638,334 (pending), both of which are assigned to the assignee of the present application and are hereby incorporated by reference.

Three-dimensional write-once memory arrays provide important economies in terms of reduced size of the memory array and associated reductions in manufacturing cost. The cost advantages are important in consumer products such as digital cameras, digital audio players, and electronic books. In these applications, the write-once memory array is preferably field programmable, and the data storage system field programs the memory array with a desired digital medium, such as a file of one or a sequence of images, a text file such as that suitable for an electronic book, or a digital audio file.

The following preferred embodiments can be practiced with any suitable memory device, and the following claims shall not be read as requiring a write-once memory device or a three-dimensional write-once memory device unless specifically recited. Also, it should be noted that any or all of the following embodiments can be used alone or in combination. Further, definitions stated in one section of the detailed description apply equally to all sections.

Figure 2:
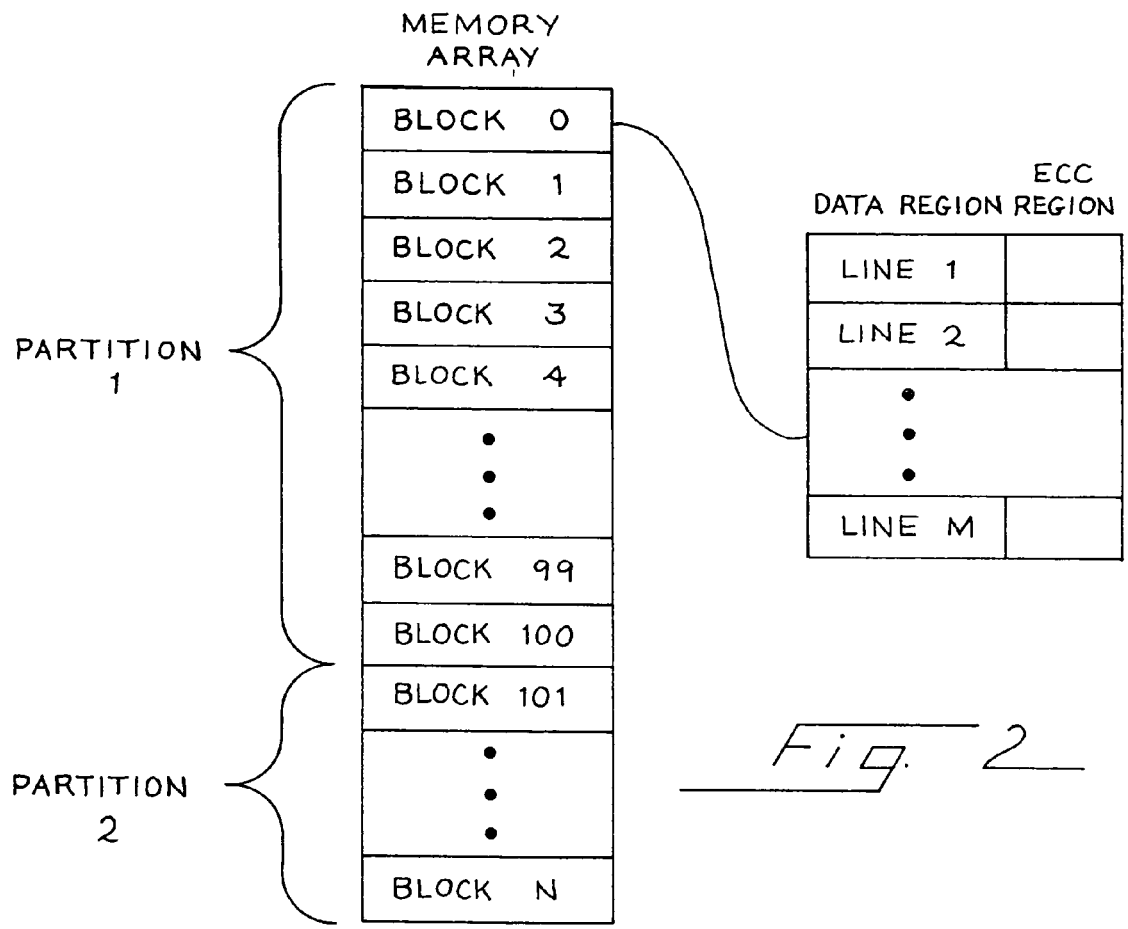
FIG. 2 is an illustration of a memory array of a preferred embodiment that is logically organized into lines, blocks, and partitions.

Turning again to the drawings, FIG. 2 is an illustration of a memory array implemented in a memory device of a preferred embodiment. In this memory array, a plurality of memory cells are logically organized into lines, blocks, and partitions. In particular, this array is logically organized into Blocks 0 to N and divided into two partitions. Partition 1 contains Block 0 to Block 100, and Partition 2 contains Block 101 to Block N. FIG. 2 also shows that Block 0 contains a plurality of lines (Line 1 to Line M), each containing a data region and an error code region. In this preferred embodiment, the error code region is an error checking and correcting ("ECC") region, and the memory device comprises a hardware component that writes an ECC code in the ECC region for each line. The ECC region is preferably hidden from the file system so that data will only be written into the data region and not into the ECC region. Accordingly, if each block contains 64 lines with each line having an 8-byte data region and a 1-byte ECC region, the file system will be able to write 512 bytes of data to each block. It should be noted that while FIG. 2 shows multiple lines, blocks, and partitions, a memory array can contain a single partition, a partition can contain a single block, and a block can contain a single line.

Dynamic Line Sizing Embodiments

In one preferred embodiment, the minimum number of memory cells that the file system can write into (i.e., the smallest writeable unit) is a single line. It should be noted that a file system "writes" into a memory cell regardless of whether the file system changes the initial digital state of the memory cell. For example, if the smallest writeable unit is 8 bytes, the file system "writes" 8 bytes of data even though some or all of the memory cells remain in their initial logic state after the write operation. Also, as noted above, the ECC region of a line is hidden from the file system so data will only be written into the data region and not into the ECC region. Accordingly, the smallest writeable unit in this preferred embodiment is the length of a line's data region (e.g., 8 bytes)—not the length of a line's data region and ECC region (e.g., 9 bytes).

To ensure that the file system writes into only the smallest writeable unit of a memory device, it is preferred that the memory device comprise an indication of its smallest writeable unit (i.e., its line size) and provide this indication to the file system. The indication can be sent in response to a read command from the file system or can automatically be sent to the file system when the data storage system is powered-up or reset. The file system can receive this indication by sensing an electronic, mechanical, or optical feature of the memory device. For example, the indication can be provided in a register in the memory array or in a device identification code of the memory device. Further, the indication can be stored when the memory device is formatted or can be pre-written into the memory device by a manufacturer of the device.

Figure 3:
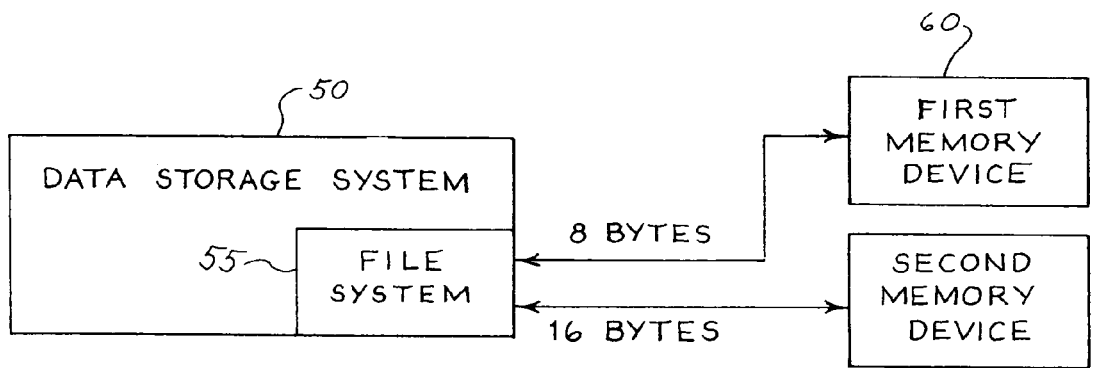
FIG. 3 is a block diagram of a data storage system and first and second memory devices of a preferred embodiment.

With this preferred embodiment, the file system dynamically responds to variability in an indicated minimum number of memory cells of respective memory devices by dynamically changing the minimum number of memory cells that the file system writes to a memory device. For example, FIG. 3 shows a data storage system 50 useable with first and second memory devices 60, 65. In this embodiment, the first and second memory devices 60, 65 take the form of modular, portable devices that are readily connected to and disconnected from the data storage system 50. The first memory device 60 has a line size of 8 bytes, and the second memory device 65 has a line size of 16 bytes. As shown in FIG. 3, when the first memory device 60 is coupled with the data storage system 50, the file system 55 is instructed to write no less than 8 bytes to the first memory device 60 during a write operation, while when the second memory device 65 is used, the file system 55 writes no less than 16 bytes during a write operation.

One advantage associated with this preferred embodiment is that variability in the smallest writeable unit is taken care of by the file system itself—not by a driver associated with the memory device. Some data storage systems use a driver to facilitate communication between the file system and a memory device coupled with the data storage system. For example, memory devices using the CompactFlash™ standard require a CompactFlash™ driver, and memory devices operating under the SmartMedia™ standard require a SmartMedia™ driver. Typically, when a new memory device is released with a smallest writeable unit that is different from that programmed into the driver, a new driver must be released and installed in the data storage system before the new memory device can be used. Because the file system of this preferred embodiment dynamically responds to the smallest writeable unit indicated by a memory device, a memory device manufacturer can redesign the smallest writeable unit of its memory device without making a new driver available for the data storage system. In this way, the file system, unlike a driver, dynamically responds to variability between the smallest writeable units of two devices.

Another advantage of this preferred embodiment relates to aligning stored data. For example, for simplicity, it may be preferred to align file structures (e.g., file name, description, and pointers) at the start of each line. If the file system were not informed of a memory device's smallest writeable unit, misalignment in the file structures may occur. For example, if the file structure is 8 bytes long, the file system would store two file structures on the 16-byte line of the second memory device 65 to maximize storage space. Because the second written file structure does not begin at the start of a line, the second file structure is not aligned with the first file structure. By informing the file system 55 that the smallest writeable unit of the second memory device 65 is 16 bytes, the file system 55 only writes the first file structure on a single line and writes the second file structure on a separate line, thereby maintaining alignment between the file structures.

Error-Code-Related Embodiments

As noted above, in one preferred embodiment, each line of the memory array contains a first set of memory cells to store data (the data region) and a second set of memory cells to store an error code representing the data stored in the first set of memory cells (the error code region). While the error code used to illustrate this preferred embodiment is an error checking and correcting ("ECC") code, it should be noted that other types of error codes (such as parity bits) can be used as an error code. In operation, when data is stored in the data region of a line, an ECC code generator determines an ECC code that represents the data, and the error code is stored in the ECC region. An ECC code generator can be implemented in hardware and/or software in the data storage system or the memory device. For example, the file system can include software to generate ECC codes, or the memory device can include a hardware component that generates ECC codes.

As described above, ECC code circuitry can be implemented external to or internal to the memory device. ECC code circuitry can impose an access time penalty approximately equivalent to 50–75 gate delays. Some memory devices implement ECC code circuitry in one or more chips separate from the memory device to avoid this penalty, which may degrade performance to an unacceptable level. Other memory devices, however, are optimized for high density and low cost and are not necessarily optimized for access speed. One such memory device is the three-dimensional, write-once electronic memory device discussed in U.S. Pat. No. 6,034,882. With these memory devices, the delays associated with integrated ECC code circuitry are relatively unimportant, and the use of integrated ECC code circuitry may be preferred since manufacturing defects and/or age-related fatigue can raise the probability of bit errors.

Turning again to the drawings, FIG. 11 is an illustration of a memory device 200 of a preferred embodiment. The memory device 200 can take any suitable form. In one preferred embodiment, the memory device 200 takes the form of a write-once memory device, while in another preferred embodiment, the memory device 200 takes the form of a three-dimensional electronic memory device. Some examples of electronic memory devices include, but are not limited to, a semiconductor-transistor-technology-based memory device (e.g., CMOS, bipolar, SiGe, GaAs), a magnetic-based memory device (e.g., magnetic tunnel junction (MTJ) memories), and an organic-electronics-based memory device. An optical memory device (e.g., CD-ROM) can also be used.

The memory device 200 of FIG. 11 comprises a plurality of memory cells 210 and ECC code circuitry 220 integrated with/embedded in the memory device 200. The ECC code circuitry 220 comprises an ECC code generator 230 and an ECC code decoder 240. The ECC code generator 230 accepts n data bits to be stored in the memory cells 210 as input and produces p ECC code bits as output. The n data bits are stored with the p ECC code bits as a k-bit word in the memory cells 210. Preferably the ECC code circuitry 220 implements a Hamming (k, n) code scheme (e.g., a Hamming (72, 64) code scheme).

When the k stored bits are retrieved from the memory cells 210, they are fed through the ECC code decoder 240. The ECC code circuitry 220 compares the parity bits computed from k (out of n) retrieved bits and compares those parity bits with the ones stored. If there is a mismatch, the ECC code circuitry 220 corrects the error (if one bit). The n corrected data bits are then outputted by the ECC code decoder 240. With a Hamming (72, 64) code scheme, the 8 ECC code bits are used to identify and correct any single-bit error in the 72-bits of stored data. (The presence of two errors in the 64-bit word can be determined but not corrected.) Accordingly, the Hamming (72, 64) code scheme permits the memory device 200 to tolerate one defective bit out of every 72 bits. This defect rate (about 1.4%) exceeds the defect percentages encountered in typical integrated circuit manufacturing.

In one preferred embodiment, the data bits and ECC code bits are stored in memory cells using the distributed data strategy described in U.S. patent application Ser. No. 09/747,574 (pending), filed on the same date as the present application. That application, which is assigned to the assignee of the present invention, is incorporated by reference herein. U.S. patent application Ser. No. 09/748,649 (pending), which is also assigned to the assignee of the present invention and incorporated by reference herein, provides additional information concerning these concepts.

As described above, an ECC code generator implements an algorithm (preferably based on the Hamming Code) to generate an output using the data to be stored in the data region as input. When data is written into and/or read from the data region, the written/read data is compared to the ECC code. For example, when data is read from the data region, the ECC generator can generate an ECC code based on the read data and compare that newly-generated ECC code with the ECC code stored in the ECC region. An error indication is provided to the data storage system if the ECC codes do not match. The ECC codes can then be decrypted to determine which bit(s) in the data is incorrect so that the erroneous bit(s) can be corrected. There are situations, however, where a mismatch between the newly-generated ECC code and the ECC code stored in the ECC region does not indicate an error. One such situation can occur with write-once memory devices.

In spite of its many advantages, a write-once memory array provides the disadvantage that a memory cell cannot be erased once it is written into. Accordingly, it is not possible to erase files from a write-once memory array by restoring the associated memory cells to their initial, un-programmed digital state (e.g., Logic 0). Novel methods for deleting stored data from write-once memory devices are presented in U.S. patent application Ser. No. 09/638,439 (pending), filed Aug. 14, 2000, which is assigned to the assignee of the present invention and is hereby incorporated by reference. As described in that patent application, data can be deleted (i.e., made difficult or impossible to read) by overwriting at least a portion of the stored data with a destructive pattern. This destructive pattern switches at least some of the memory cells associated with the stored data from an original, un-programmed state to a programmed state. For example, some or all of the memory cells associated with stored data can be over-written with the destructive pattern (111111). Any suitable destructive pattern (periodic or aperiodic) that achieves the desired result of obliterating the data can be used.

Figure 4A:
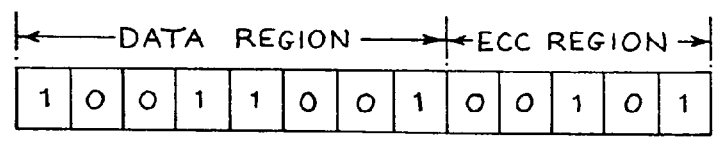
FIGS. 4a, 4b, and 4c are schematic diagrams of a plurality of memory cells of a write-once memory device of a preferred embodiment.
Figure 4B:
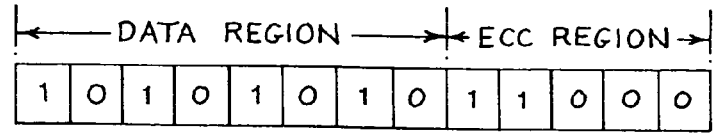
Figure 4C:
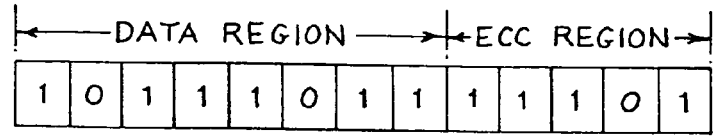

FIGS. 4a through 4c provide a specific example of this operation for a write-once memory. FIG. 4a shows data (10011001) stored in the data region of a line. The error code representing the data (00101) is stored in the ECC region. To delete or obliterate this data, the destructive pattern (10101010) shown in FIG. 4b is written into the data region of the line. Because the memory device is a write-once device, only the un-programmed bits are affected by this write operation. Accordingly, the data stored in the data region after the destructive pattern is written is the OR of the original data (10011001) and the destructive pattern (10101010). The result (10111011) is shown in FIG. 4c. When the destructive pattern is written into the data region, the error code representing that pattern ((11000), as shown in FIG. 4b) is also written into the ECC region of the line. However, because only un-programmed bits are affected by a write operation in a write-once memory device, the resulting error code in the ECC region will be the OR of the original ECC code (00101) and the ECC code of the destructive pattern (11000). The result ((11101), shown in FIG. 4c), however, does not represent the data stored in the data region (10111011). Accordingly, a comparison of the ECC code with the data stored in the data region will indicate a false error. Such a false error may have the undesired effect of re-writing or correcting the data properly stored in the data region.

To overcome this problem, it is preferred that the file system disregard the error code for "deleted" data. For example, an indication that the data is deleted can be stored by the file system in the form of a flag bit designated in a file listing or an entry stored in a table of deleted data. In this way, to determine whether data is deleted data, the file system determines whether such an indication was stored. Alternatively, the file system can recognize deleted data by recognizing that the data stored in the data region is the destructive pattern. For example, if the destructive pattern is a series of 1's, the resulting data will also be a series of 1's. If the error codes do not match in this situation, it is likely that the data is deleted data, and the file system can disregard the error code. "Disregard the error code" is intended to broadly refer to any act or omission that prevents the undesired effect of re-writing or correcting the data properly stored in the data region. For example, an error code can be disregarded by disabling a comparison of the data stored in the data region with the error code or can be disregarded by ignoring an error resulting from such a comparison.

It is should be noted that the set of memory cells can be other than a data region of a line. For example, the set of memory cells storing data can be a block of lines. Also, while the error code region was associated with a single line in the above-described preferred embodiment, an error code region can be associated with a block of lines or with a file. Further, the term "set" is intended to refer to one or more, and the un-programmed digital state can be either Logic 0 or Logic 1 (or Logic 2 in a three-state digital system).

Micro-Allocator Embodiments

Figure 5:
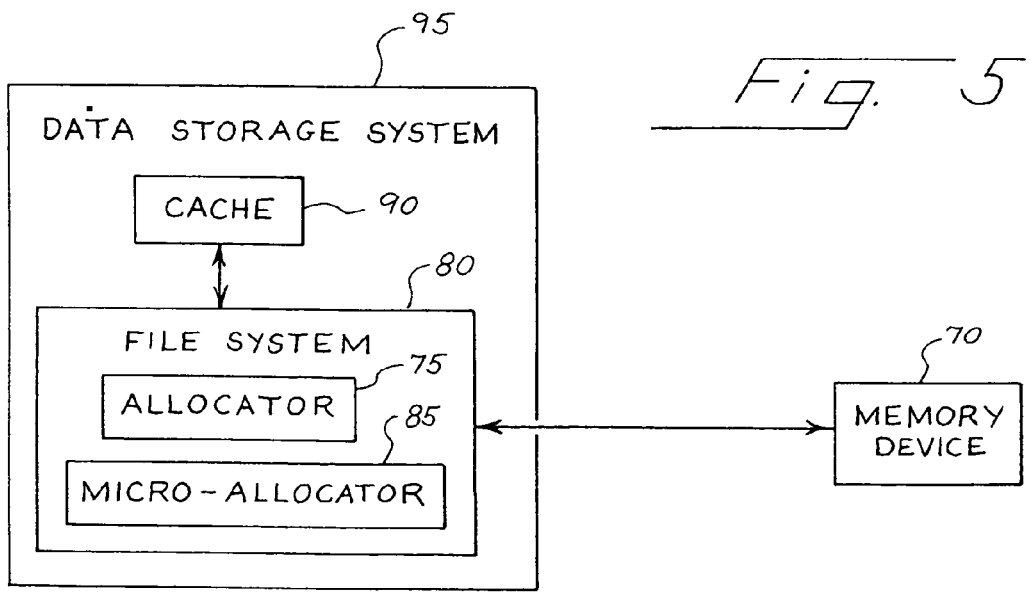
FIG. 5 is a block diagram of a data storage system and memory device of another preferred embodiment.

As described above, in one preferred embodiment, the memory device is logically organized into a plurality of blocks, each block comprising a plurality of lines. The term "block" as applied to memory cells refers to a contiguous set of memory cells. With reference to FIG. 5, to store a file in a memory device 70, an allocator 75 of a file system 80 determines the size of the file that is to be stored and allocates an appropriate number of blocks in the memory device 70 for storing the file. As shown in the example illustrated in FIG. 6, Blocks 1–4 are allocated for a first file. Although four blocks are allocated, the first file may not completely fill one of the blocks. This may occur, for instance, with a small file or with a large file that has been segmented into smaller portions. This may also occur with a small remainder of a file after it has already filled other blocks, as illustrated in Block 4 of FIG. 6. The first file only partially fills Block 4, leaving Lines 4–6 available. Because the allocator 75 only allocates memory in block units, when a second file is to be stored in the memory device 70, the allocator 75 allocates additional blocks for the second file (e.g., Blocks 5–10) and leaves the available space in Lines 4–6 of Block 4 unfilled.

Figure 6:
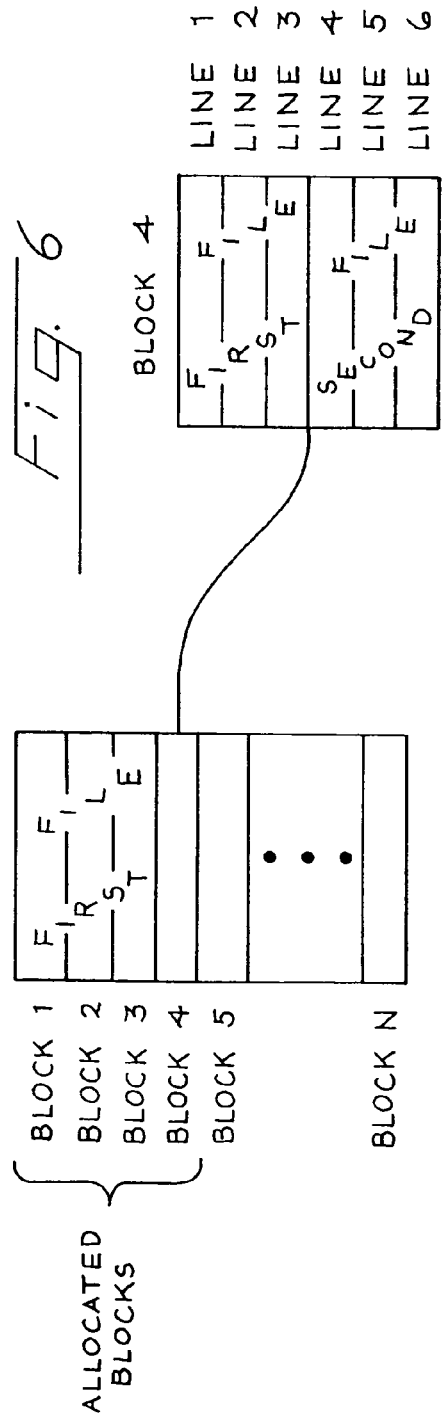
FIG. 6 is an illustration of a memory array of a preferred embodiment in which part of a memory block is filled with a first file and the remainder of the block is filled with a second file.

To prevent wasting of available memory space, it is preferred that the file system 80 comprise a micro-allocator 85 to keep track of a block (preferably, each block) and report which lines have been used (or which lines are available) to a block-tracking device such as an allocation table. This provides the advantage of using lines that otherwise would have been wasted. With the use of a micro-allocator 85, available Lines 4–6 can be used to store a second file, as shown in FIG. 6. If there are remaining portions of the second file to be stored, the allocator 75 would then determine the size of the remaining portions and allocate an appropriate number of blocks in the memory device 70. The remaining portions of the second file would then be stored in the allocated blocks, with the micro-allocator 85 determining which lines are available in the allocated block. As is clear from this example, the term "file" refers to either a complete file or a portion of a file, such as the portion of the first file stored in Lines 1–3 of Block 4.

In an alternate embodiment, instead of allocating blocks in the memory device 70 itself, the allocator 75 can allocate blocks in a memory cache 90 (e.g., RAM) of the data storage system 95. In this way, data can be cached prior to actually committing it to the memory device 70. In this embodiment, the allocator 75 would allocate blocks held in the cache 90, the micro-allocator 85 would track line usage of the cached block, and the file system 80 would store the cached data in the memory device 70 when the cached block is full. Use of this alternate embodiment may be especially desired when the memory device 70 takes the form of a write-once memory device. Because stored data cannot be over-written in a write-once memory device, the file system cannot re-organize stored data as it can with a write-many memory device. By using this preferred embodiment, the allocator 75 can allocate a number of blocks into the cache 90, and the file system 80 can use the cache 90 as a workspace in which to write and re-write data. For example, if the blocks of FIG. 6 were allocated in the cache 90, the file system 80 could move Lines 4–6 of Block 4 to another block closer to the remainder of the second file. The micro-allocator 85 could then indicate that Lines 4-6 were available for additional data. After those lines are filled, the file system 80 could store Block 4 in the write-once memory device. Of course, a cached block can be written to the memory device before the cached block is filled.

"Skid Pad" Embodiments

As described above, when a file is stored to the memory device, the allocator determines how many blocks to allocate in the memory device. After the file is stored, the file system stores a file structure for that file in the memory device. The term "file structure" is intended to refer to data that describes a file. In one embodiment, a file structure describes a file and how a file system can use the file. For example, a file structure can describe the name, type, location, size, and other attributes of a file, as well as the type of commands that a file system can or cannot use with that file. For instance, a file structure can indicate that a file is "read-only" and, accordingly, cannot be modified by a file system. As another example, the file structure can be a file "footer," which can be a data pattern indicating that the file stored in the block is complete or a pointer to a memory location storing the next portion of the file (or to a table storing such a pointer). Of course, other file structures in addition to these examples can be used.

Because file structures are written after a file is stored in memory, problems can arise with write-once memory devices if all of the allocated space for that file is filled before the file structures can be written. For example, if the data storage system records a digital representation of streaming data (e.g., voice data), the streaming data can fill the entire allocated memory space, leaving no room for file structures. Because file structures have not been written, when the file system reads the stored data, it will not know whether the file is complete or where to look for the additional portions of the file. A similar problem is encountered if a catastrophic failure occurs during the write operation (such as a power failure or a user removing the memory device from the data storage system). With a write-many memory device, the file structure can be stored at another memory location, and the file system can later re-organize the stored data to place the file structure with the stored file. However, this re-organization is not possible with write-once memory devices.

To overcome this difficulty, when the file system writes a file to a block (or any other type of contiguous set of memory cells, such as a line), the file system preferably reserves at least one memory cell in the block for file structures for that file. In this way, the file system creates a "skid pad" in the block for the file structures. It is preferred that this "skid pad" not be visible to an end user so that files too large to fit in the unreserved memory cells will not be attempted to be written into the reserved memory space.

Figure 7C:
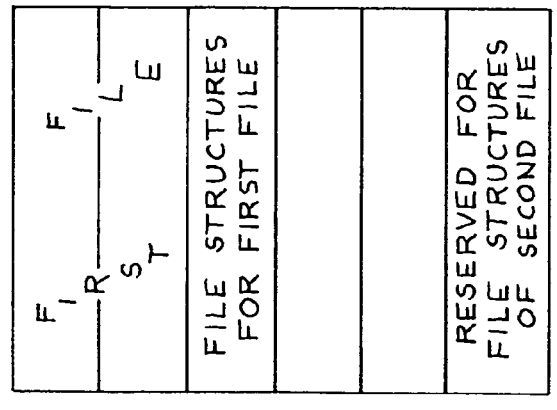
FIGS. 7a, 7b, and 7c are illustrations of how file structures of a file are reserved in a memory device of a preferred embodiment.
Figure 7B:
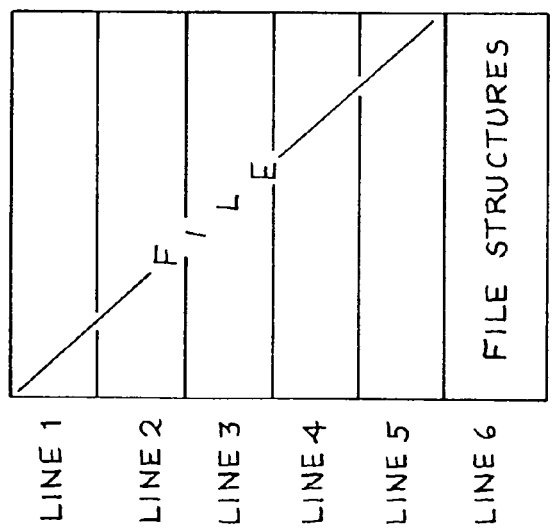
Figure 7A:
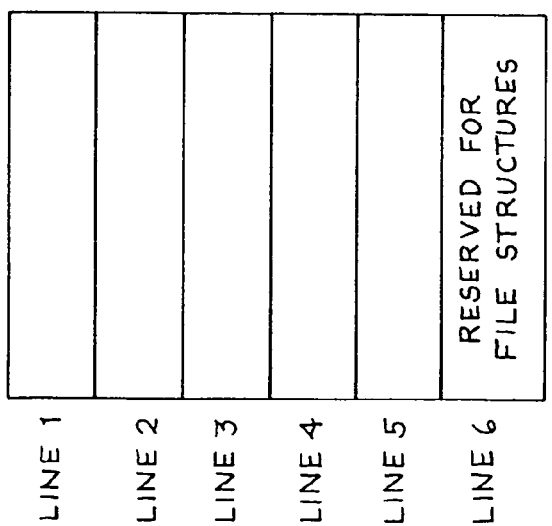

The use of a "skid pad" will now be illustrated in conjunction with FIGS. 7a–7c. As shown in FIG. 7a, Line 6 of a block is reserved for file structures of a file to be saved in that block. The number of memory cells reserved for file structures can be determined by the file system. When a file is stored in the block, only those lines that are not reserved for the file structures are used to store the file (Lines 1–5). If the file is more than five lines long, the file structure for the file is stored in Line 6, as shown in FIG. 7b. If the file structure can be stored in the unreserved memory cells, the reserved memory cells can be used to store other data. For example, if Line 6 in FIG. 7a were reserved for the file structures of a first file and the file system were able to save file structures for the file in an unreserved line (as shown in FIG. 7c), Line 6 can be used to store other data. In FIG. 7c, Line 6 is "re-used" as reserved space for the file structures of a second file being stored to that block.

Figures 8A, 8B:
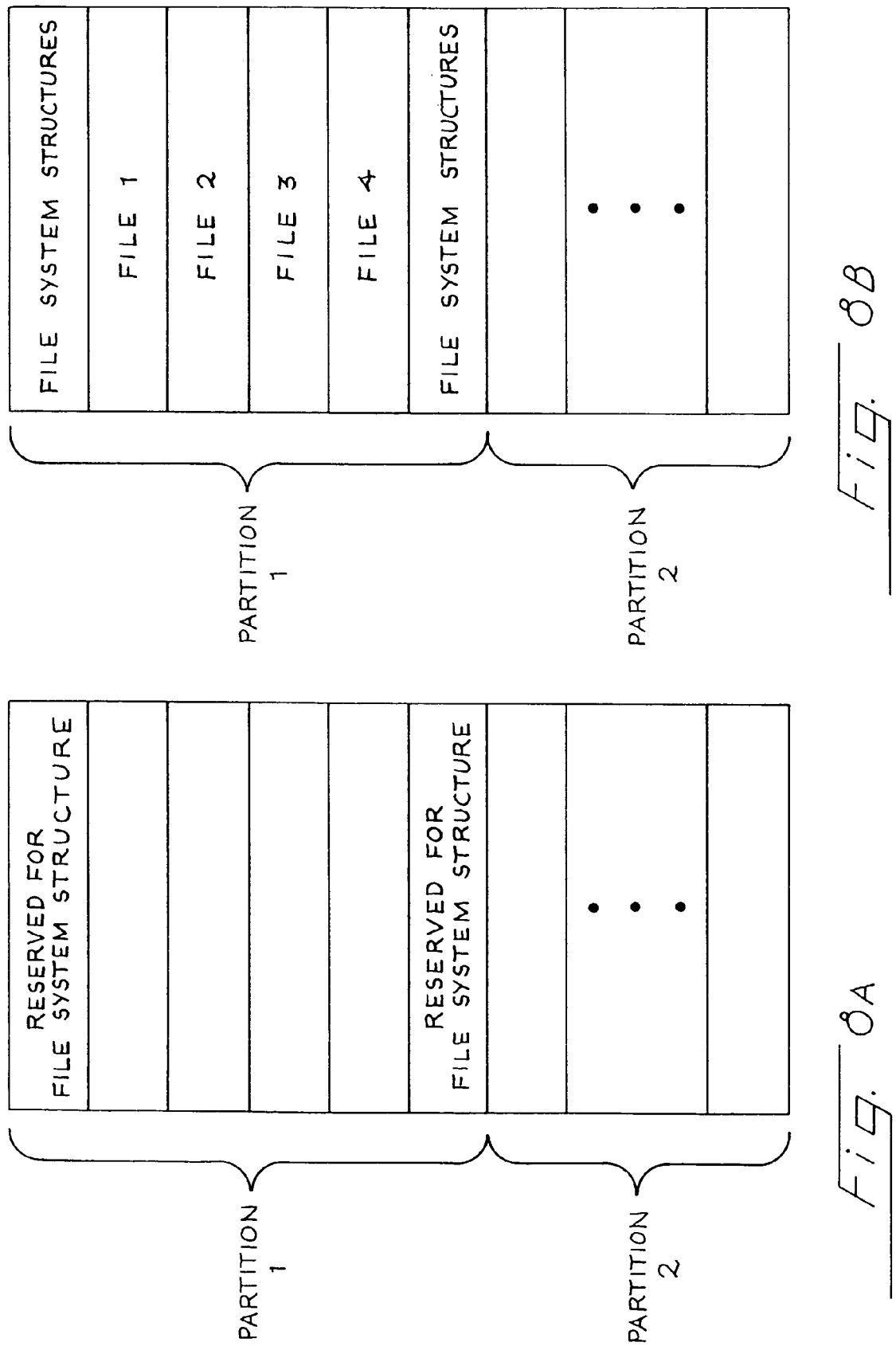
FIGS. 8a and 8b are illustrations of how file system structures of a partition are reserved in a memory device of a preferred embodiment.

The "skid pad" concept can also be used for file system structures. Whereas a file structure refers to data that describes a particular file, a "file system structure" refers to any data that describes a partition in memory, the memory space within the partition, and/or the type of commands that a file system can or cannot use with that partition. For example, a file system structure can be data describing where a file resides and can be used by a file system to find that file or free memory cells in a memory device. As another example, a file system structure can indicate that a partition is "closed" and, accordingly, cannot be modified by a file system. A file system structure can take the form of an allocation table, a listing of stored files, a search tree, a boot block, a partition header, a partition footer, a description of contents of the memory device, and configuration information, as well as a listing of the file structures of the files stored in a partition. Of course, other file system structures in addition to those listed above can be used. FIGS. 8a and 8b illustrate this embodiment. When the file system creates a partition in the memory device, the file system reserves at least one memory location for file system structures of the partition (here, the first and last block of the partition). The file system stores files in the partition in any unreserved memory location, as shown in FIG. 8b. In this way, if the partition is completely filled with files, there will be room for file system structures of the partition. Further, a file system may expect to find file system structures at certain memory locations. Reserving space in the memory for file system structures ensures that other data (such as a file) will not be written into those locations.

Multiple-File-System-Structures Embodiments

Figure 9A:
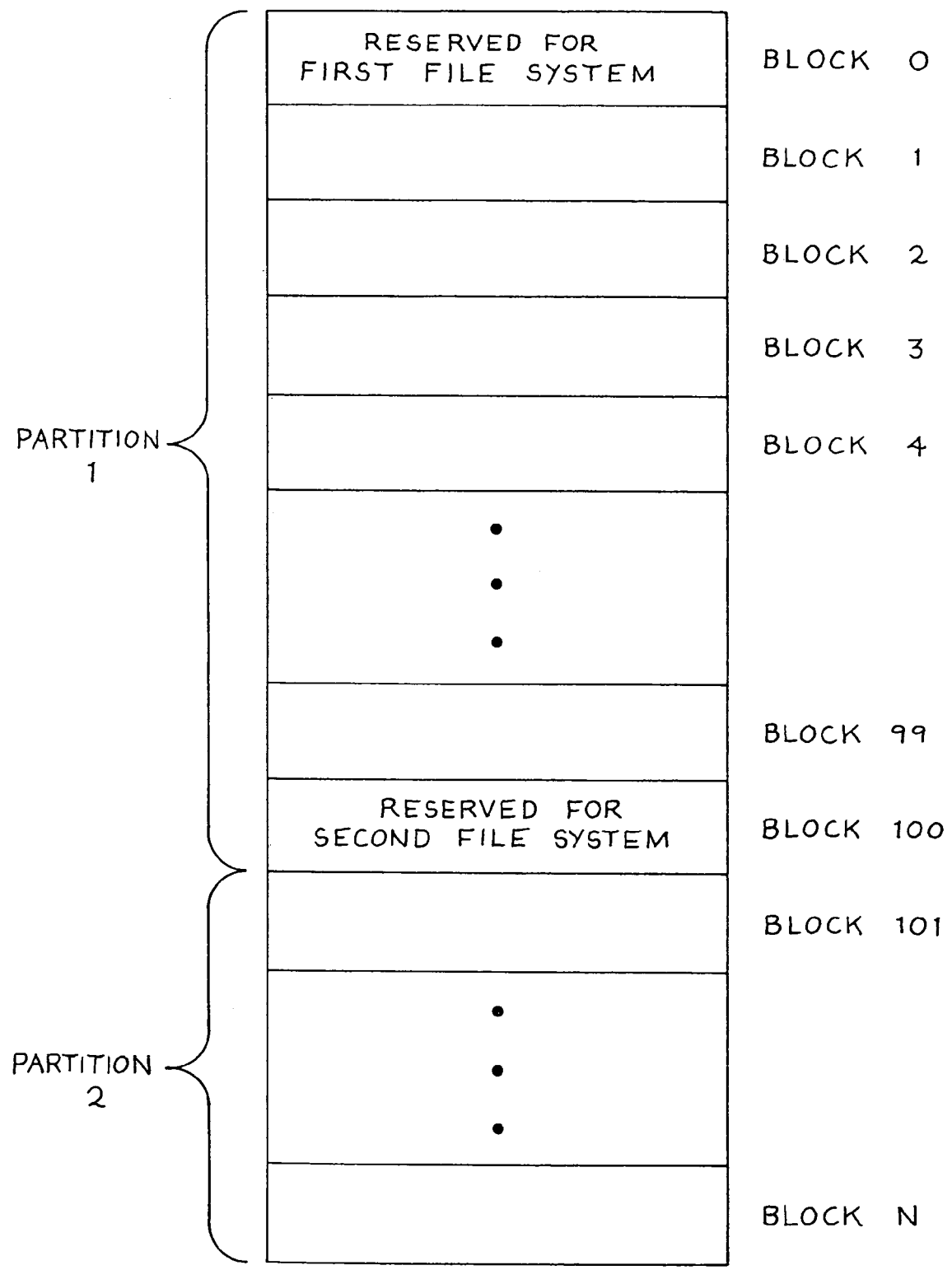
FIGS. 9a and 9b are illustrations of a memory device of a preferred embodiment in which file system structures of two file systems are stored in a single memory partition.
Figure 9B:
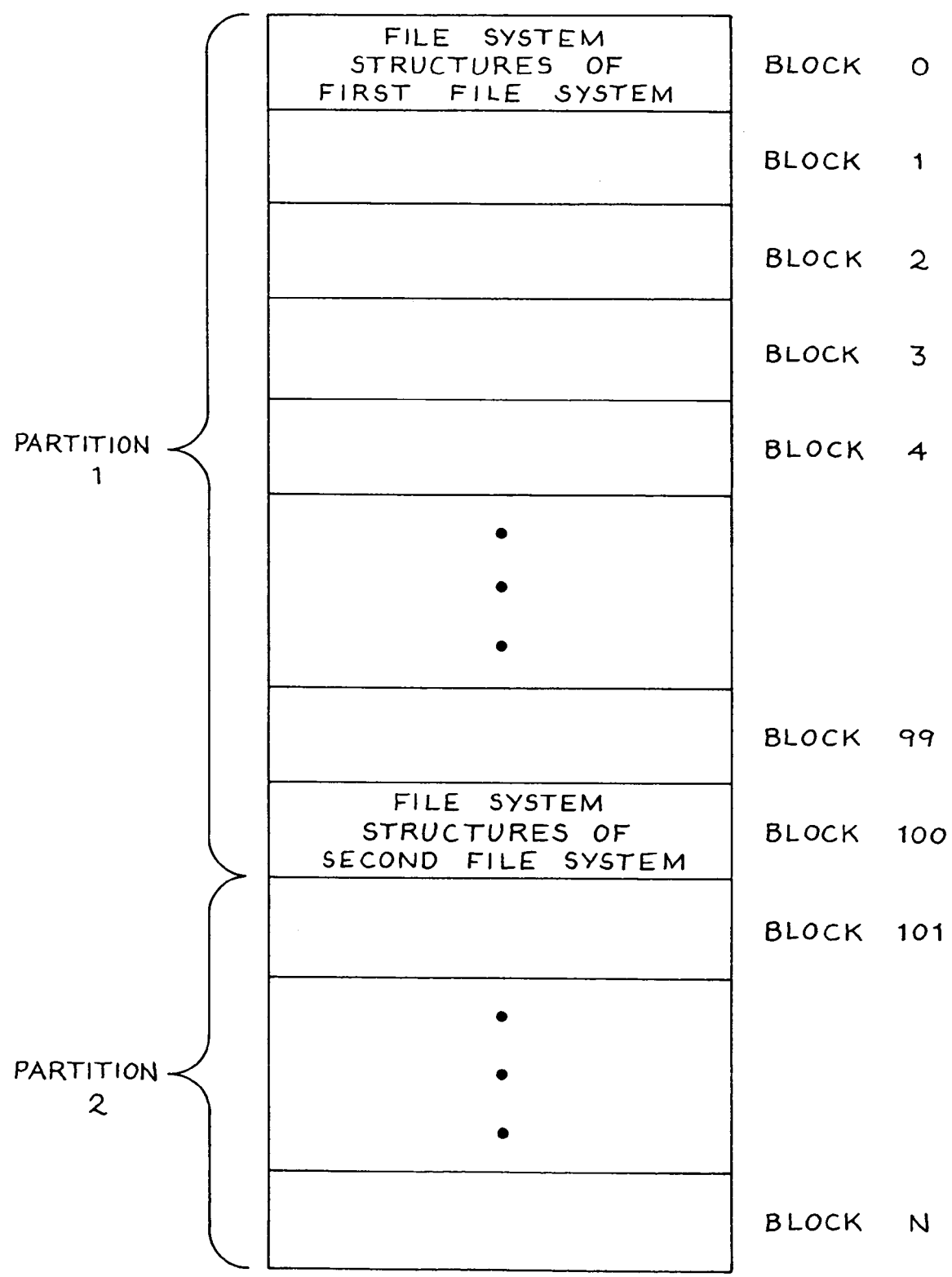

In another preferred embodiment, a memory device is presented where file systems structures for two or more different file systems are stored in the same partition of a memory device, such as the memory device shown in FIG. 9b. Preferably, a partition comprises a set of memory cells with a single addressing scheme. By storing file systems structures for multiple file systems in the same partition of a memory device, the memory device can be read by a larger number of media readers. For example, a data storage system such as a digital camera can store file system structures for multiple file systems to ensure that pictures stored on the memory device can be read by a prominent file system. In operation, once the memory device is filled with pictures and file system structures of one file system are stored in the memory device, the digital camera can "close" the memory device by storing file system structures of additional file systems. For example, the camera can store DOS FAT file structures (e.g., FAT Table, boot sector, etc.) so that the memory device can be read on any DOS reader as well as a reader using the primary file system.

The file system structures for the additional file systems can be written to the memory device in response to a request from a user, such as when the user provides an indication to the data storage system that he does not want to store any more data on the memory device. In response to this indication, the file system or another application of the data storage system can add the file system structures for the other file systems. Alternatively, the file system can automatically write the additional file system structures when the file system detects that the memory device is full or virtually full.

With write-once memory devices, if the locations for file system structures of a file system are written with data, the file system structures of that file system will not be able to be written onto the memory device. Accordingly, to leave open the option of writing additional file system structures of other files systems, the "skid pad" concept discussed above can be used. That is, after a partition is created in the memory device, memory cells are reserved in the appropriate locations in the partition for file system structures of the additional file systems. As an example, if one wanted to close the memory device to be DOS FAT compatible, the first address of the memory device would be reserved for the boot sector structure. As a simplified example of this, consider FIGS. 9a and 9b. FIG. 9a shows that Block 0 in Partition 1 is reserved for file system structures of a first file system and that Block 100 in Partition 1 is reserved for file system structures of a second file system. The file system structures of the first and second file systems are later stored in their respective reserved locations, as shown in FIG. 9b. While FIG. 9b shows file system structures of two file system stored in a single partition in the memory device, it should be noted that file system structures of more than two file systems can be stored.

Closing-the-Media Embodiments

In another preferred embodiment, data stored on a memory device, such as a file or a partition, is permanently prevented from being modified (i.e., the data is "locked" or "closed"). In many situations, it is desirable to modify data stored in a memory device. However, there are other situations in which one wishes to prevent the stored data from ever being modified. For example, consider the situation in which a memory device stores executable code (e.g., for a video game or a digital book) in one partition and user information (e.g., for high scores or notes) in another partition. In this situation, it may be desired to prevent the executable code from being modified. As another example, it may be desired to prevent user-stored information (such as a picture taken with a digital camera) from being erased or changed once it is stored. Some re-writeable media, such as hard disks, can store a read-only or an archive flag along with data that is to be protected from modification. However, because such flags can removed, this method of protection does not ensure that the data will never be modified. Further, the use of write-once media alone does not ensure permanent protection of data because, as described above, stored data can be modified by overwriting the data with a destructive pattern (i.e., switching memory cells from an un-programmed to a programmed state).

In one preferred embodiment, a file is permanently prevented from being modified by storing an indicator in a file structure of the file. Any file system reading that file structure would be prevented from modifying the file and would be programmed to prevent modification or removal of the indicator. Alternatively, if a write-once memory device is used, the media itself ensures that the indicator is non-modifiable if the indicator is in a programmed state. In another preferred embodiment, a partition is permanently prevented from being modified by permanently preventing the file system from allocating memory cells in the protected partition. In one implementation, the file system's allocator is disabled, thereby preventing the file system from allocating any blocks of memory in the partition. In another implementation, the file system's allocator is replaced by another allocator that is given no space to allocate. Similar to protecting files, a partition can be permanently protected by storing an indicator in a file system structure of the partition, and a file system reading that file system structure would be prevented from modifying the partition. As above, a file system can be programmed to prevent modification or removal of this indicator or, if a write-once memory device is used, the media itself ensures that the indicator is non-modifiable if the indicator is in a programmed state. With these preferred embodiments, the protected data (files or partitions) is permanently and finally "locked" or "closed."

Temporal-to-Spatial Mapping Embodiments

Turning again to the drawings, FIGS. 10a–10c illustrate a method for identifying memory cells storing data in a memory device of a preferred embodiment. This method provides the advantage of locating stored data when the location of the data is not known to the file system a priori. FIG. 10a shows a set of memory cells. The first line of memory cells stores data (1101), and the remaining five lines of memory cells store an identification pattern (0000). FIG. 10b shows additional data (1110) stored in the second line of memory cells (i.e., between the memory cells storing the previously-stored data (1101) and the memory cells storing the identification pattern (0000)) by overwriting the identification pattern stored in the second line. To identify the memory cells that store the newly-written data (1110), the file system identifies those cells that are adjacent to the memory cells storing the identification pattern. For example, the file system can be programmed to identify the memory cells that are within a predetermined number of memory cells adjacent to the memory cells storing the identification pattern (e.g., four memory cells or one line). Alternatively, the file system can be programmed to identify the memory cells that are between two sets of memory cells storing the identification pattern. For example, in FIG. 10c, data (0110) and (1001) are identified because they are located between the memory cells storing the identification pattern (0000) in the third and sixth lines of the memory array.

This method for identifying memory cells provides particular advantages for write-once memory devices. These advantages will be discussed in terms of storing data describing a file. It should be noted that the method and its associated advantages are equally applicable to other applications. File listings in a memory device often store the name and attributes (such as date and time created, read-only, executable, etc.) of a file and a pointer listing the address where the file is actually contained in the memory. If the file is later moved in memory, the file system simply writes the new address of the file over the old address of the file. Similarly, if a new file is later stored at the address indicated by the pointer, the file system can write the name of the new file over the name of the old file. Accordingly, if data changes after it is stored, the modified data is written over the previously-stored data at the same location. This technique of modifying data will be referred to as temporal mapping—although data changes at a later time, its location remains the same. For this reason, the file system knows exactly where to locate data. For example, the pointer to a specific file will always be in the same location regardless of whether the pointer to that file changes.

Because a write-once memory device cannot re-write over a previously-written location, the temporal mapping technique described above cannot be used with a write-once memory device. Instead, new data is written to a new location. When new data is written, it is preferred that the old data be deleted using the deletion method described above and in U.S. patent application Ser. No. 09/638,439 (pending), filed Aug. 14, 2000, to ensure that the file system does not recognize the original data (e.g., pointers) as the current data. To determine the location of the new data, it is preferred that the identifying technique described above be used. This technique will be referred to as spatial mapping (in contrast to temporal mapping)—when data changes at a later time, its location also changes.

Turning again to FIGS. 10a–10c, data (1101) represents a pointer to a particular file. Here, the memory cells storing the identification pattern are all in an un-programmed logic state (e.g., Logic 0). When the location of the file changes, a new pointer (1110) is written to the memory device (see FIG. 10b) by overwriting the identification pattern in the next available line. To identify the location of the new pointer, the file system locates the memory cells that are adjacent to the memory cells in the un-programmed Logic 0 state. That is, the file system recognizes the string of zeros to mean that the data stored before the string of zeros is the current data. In this way, writing new pointers over existing zeros, while leaving more zeros at the end of the memory cells, allows the file system to recognize which pointers are the most current. In essence, the task of finding the most current data reduces to merely finding the last nonzero entry in the memory cells. If the entire set of memory cells storing an identification pattern is overwritten, additional modifications may not be possible. To avoid this situation, it is preferred that the pointer point to an additional pointer tree (instead of to the file itself) to increase the number of modifies that can occur.

In the preceding example, it was assumed that the file system was programmed to identify a line of data that is adjacent to the memory cells storing the identification pattern. In this way, the identified data was of a predetermined size (i.e., a predetermined number of memory cells, such as a line). To identify data of a variable size, the file system can be programmed to identify memory cells that are between two sets of memory cells storing the identification pattern, as shown in FIG. 10c. Additionally, when the old data is deleted with a destructive pattern that results in a predetermined pattern of data being stored in the old location (e.g., a string of ones), the file system can be programmed to identify the memory cells that are between a set of memory cells storing the predetermined pattern of data (e.g., the string of ones) and a set of memory cells storing the identification pattern (e.g., the string of zeros). In this situation, the file system is preferably programmed to ignore the predetermined pattern rather than recognize it as valid data.

Although the spatial mapping technique was illustrated above in conjunction with file descriptors and pointers, this technique can be used in any other suitable application in which data is updated. For example, this technique can be used in a calendaring application (where entries to a particular time or date in a calendar change over time) or in a picture editing application (where new picture are stored) run by a data storage system coupled with the memory device. The above description of the operation and advantages of this technique applies equally to these other applications. Additionally, while the preceding illustration used a string of 0s as an identification pattern, other identification patterns can be used to achieve the desired result of identifying stored data. For example, instead of the identification pattern being a string of memory cells in their un-programmed logic state (e.g., Logic 0), the identification pattern can be a string of memory cells, some of which are in their un-programmed logic state and some of which are in a programmed logic state (e.g., (0011)).

In another preferred embodiment, the location of data stored in a first set of memory cells of a memory device is identified by an identifier that is stored adjacent to the data. For example, an identifier can be stored in the middle or at an end (the beginning or the end) of the stored data. The identifier would instruct the file system how much memory on one or both sides of the identifier is data. The identifier can be fixed or dynamic. For example, instead of using the same identifier each time new data is written to the memory device, the identifier can change to indicate that new data is being written or to indicate how many times new data has been written to the memory device. In one embodiment, the length of the identifier changes with each new data write, while in another preferred embodiment, data stored in the identifier itself changes. For example, an incrementing, multiplying, or incrementing alternating pattern can be used to provide the indication. In yet another preferred embodiment, the identifier is added to the end of the stored data indicating whether the stored data is valid or invalid. For example, one bit can be added to a line or block. If the bit is not present, the file system would know that the preceding data is valid. Conversely, if the bit is present, the file system would ignore the data.

Three-Dimensional Memory Devices

Pillar Three-Dimensional Memory Devices

In one embodiment of the present invention, a conductor layer (say, conductor layer number J) runs north-to-south, and adjacent conductor layers (numbers J−1 and J+1) run east-to-west. Wherever a conductor's vertical projection on layer (J) crosses over a conductor on layer (J−1), a memory cell pillar is created. Similarly, wherever a conductor's projection on layer (J+1) crosses a conductor on layer (J), a memory cell pillar is created. Memory cell pillars are defined and patterned by the intersection (crossover) of the conductors, and so the pillars are self aligned to the conductors. Self alignment is an extremely important advantage, because it lets the photolithographic patterns of the memory cell be designed without including any extra allowance for misalignment tolerances. Thus the pattern features of our self aligned memory cell may be made smaller, resulting in a smaller cell area, which gives higher density and lower cost.

For purposes of illustrating the self aligned fabrication of these pillars, consider an embodiment which uses four sequential layers of material (a "layer stack") to fabricate the steering element and the state change element. In this illustrative example the steering element consists of a polycrystalline silicon PN junction diode, and the state change element consists of a poly-oxide-poly dielectric rupture antifuse. Other embodiments are set forth in the body of this application.

Figure 12A:
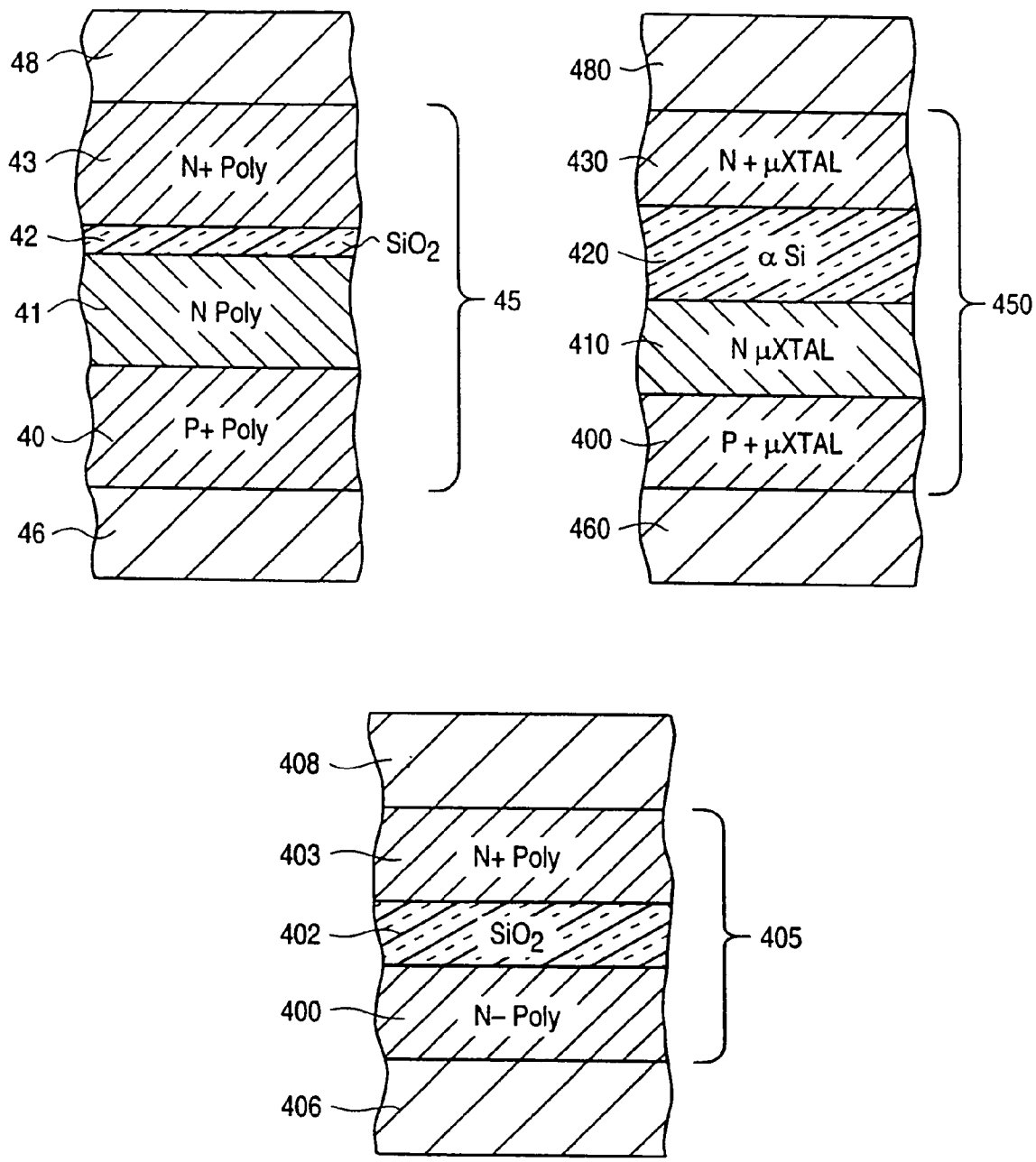
FIG. 12(a) shows three cross-sectional views of layers used to fabricate different embodiments of a memory cell built in accordance with the present invention.

In this embodiment, a pillar contains four layers of material in a layer stack, deposited sequentially as shown in FIG. 12(a): (1) a layer of P+doped polysilicon 40; (2) a layer of N−doped polysilicon 41; (3) a layer of silicon dioxide 42; (4) a layer of N+doped polysilicon 43. Layers (40) and (41) form a PN junction diode (the steering element), and layers (41–43) form a poly-oxide-poly dielectric rupture antifuse. In this embodiment the stack of four materials which together create the memory cells are referred to as the "layer stack" 45. There are also a conductor layer below and above the layer stack 45 which is patterned as will be described. These are shown as conductors 46 and 48 in FIG. 12(a).

An alternate stack is shown in FIG. 12(a) as stack 450. Again it includes conductors at the ends of the stack, specifically 460 and 480 which may be fabricated from any conductive material such as a metal or a polysilicon. The steering element in stack 450 comprises a first layer 400 of P+doped semiconductor such as microcrystalline silicon, and a second layer 410 of N doped semiconductor such as microcrystalline silicon.

The state change element comprises the layer 420. Layer 420 may be an amorphous silicon layer used to form an antifuse. This layer has a nominal high resistance, however, after a large current is passed through it for programming, its resistance will be substantially lower. The layer 430 is shown as an N+ layer to provide good electrical contact to the overlying conductor 480. Layer 430 could be amorphous, microcrystalline or polysilicon but the processing methods need to be low temperature to maintain the amorphous structure in layer 420.

Another stack 405 is also shown in FIG. 12(a). It comprises an N-polysilicon layer 400, a silicon dioxide layer 402 and an N+polysilicon layer 403. Again, the layers 400 or 403 could be microcrystalline or amorphous semiconductor layers. The stack 405 is sandwiched between the conductors 406 and 408. Here the steering element is a Schottky diode formed by the metal of conductor 406 and the layer 400. The state change element is an antifuse formed by layer 402. By way of example, layers 406 and 408 may be titanium silicide or aluminum with a thickness of approximately 1000 A. The layers 400, 402 and 403 may be 500 A, 80 A, and 500 A in thickness, respectively.

Figure 12B:
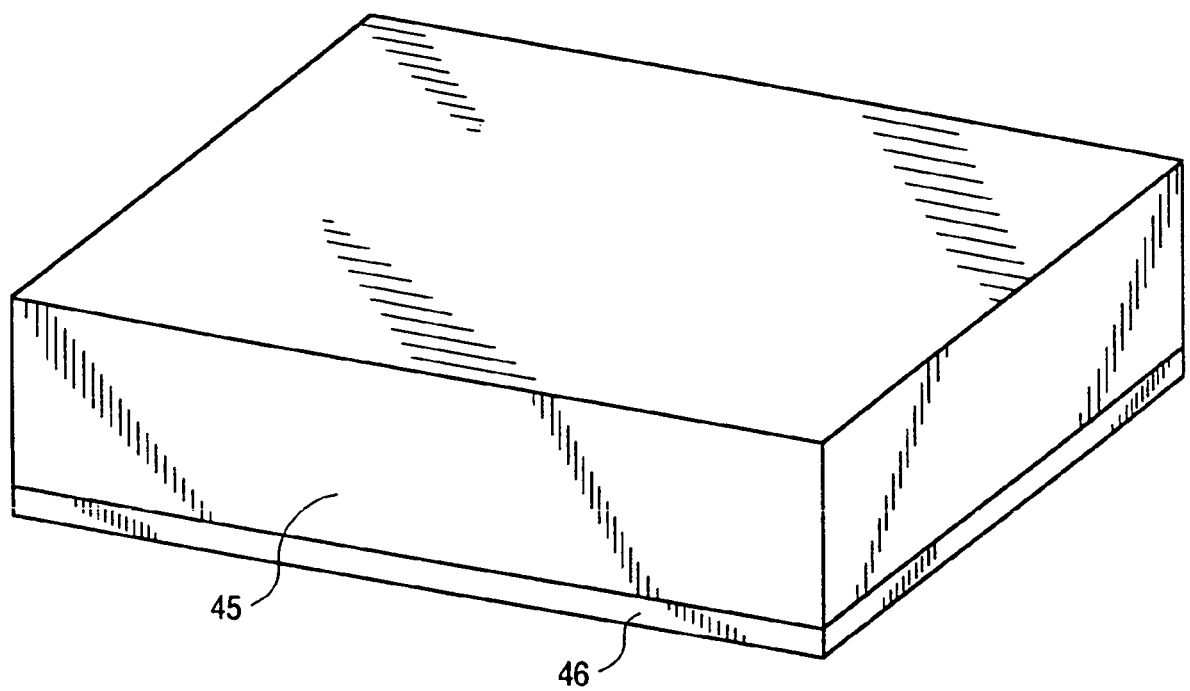
FIG. 12(b) is a perspective view of a conductor layer and layer stack used in the fabrication of a memory cell built in accordance with the present invention.

The fabrication sequence for the memory cell is schematically illustrated in FIGS. 12(b)–12(g). After deposition and before patterning, the layer stack 45 (or the stacks 450 and 405) is a continuous sheet that extends across the entire integrated circuit (indeed across the entire wafer) such as shown in FIG. 12(b). Conceptually the selfalignment method is a two-etch-step procedure: In the first etch step, this layer stack (a continuous sheet) is patterned into long straight strips running (say) east-to-west, by etching them with the same patterning step that etches the east-to-west conductors on the conductor layer below. After deposition and planarization of an interlevel dielectric, a second conductor and layer stack is deposited. This stack is patterned into long straight strips running north south. Etching used to pattern the north-to-south lines continues until the first layer stack has also been etched through the steering element. This results in pillars formed on the east-to-west running lines. The resulting pillars are perfectly aligned to both the conductor below and the conductor above since both the pillars and the conductors are etched simultaneously. In alternate embodiments the semiconductor layers within the layer stack (45 or 450 or 405) may be deposited as microcrystalline or polycrystalline, and then laser treated to improve crystallinity and enhance the dopant activation.

The cross-section of the pillar will be rectangular with one dimension being equal to the width of the bottom conductors and the other dimension equal to the width of the top conductors. If these conductors have equal width then the cross-section will be square.

The patterning in both east-to-west and north-to-south uses well-known photolithographic steps widely used in the semiconductor industry and may use either wet or dry etching. Also, the silicon used in the cells and when used for the conductors may be doped insitu or after being deposited, for example, by ion implantation.

Of course other patterning technologies may be used rather than etching, for example "liftoff" technology or "Damascene" technology or an additive rather than subtractive patterning technology may be employed instead of etching. But ideally the layer stack should be patterned in two separate steps, once with the mask that defines the conductors below, and again with the mask that defines the conductors above. This holds true regardless of the specific fabrication techniques used to pattern the various layers.

In practice a large number of vertically stacked memory cells are built, and each conductor layer is self aligned to both the layer stack below, and the layer stack above. Therefore the etching steps which selfalign the conductors to the pillars, must etch away material from three different layers: the layer stack above, the conductor layer, and the layer stack below.

The processing may begin with a wafer that may have received prior processing steps, for example, CMOS transistors may be fabricated in the monocrystalline substrate for the peripheral circuitry. An insulator then is deposited, and preferably, planarized (using chemical-mechanical polishing ("CMP"), resist etchback planarization, or any of a number of other technologies for planarization). The first conductor layer is deposited such as layer 46 of FIG. 12(b), and then the first layer stack 45 is deposited. FIG. 12(b) shows the wafer at this stage.

Figure 12C:
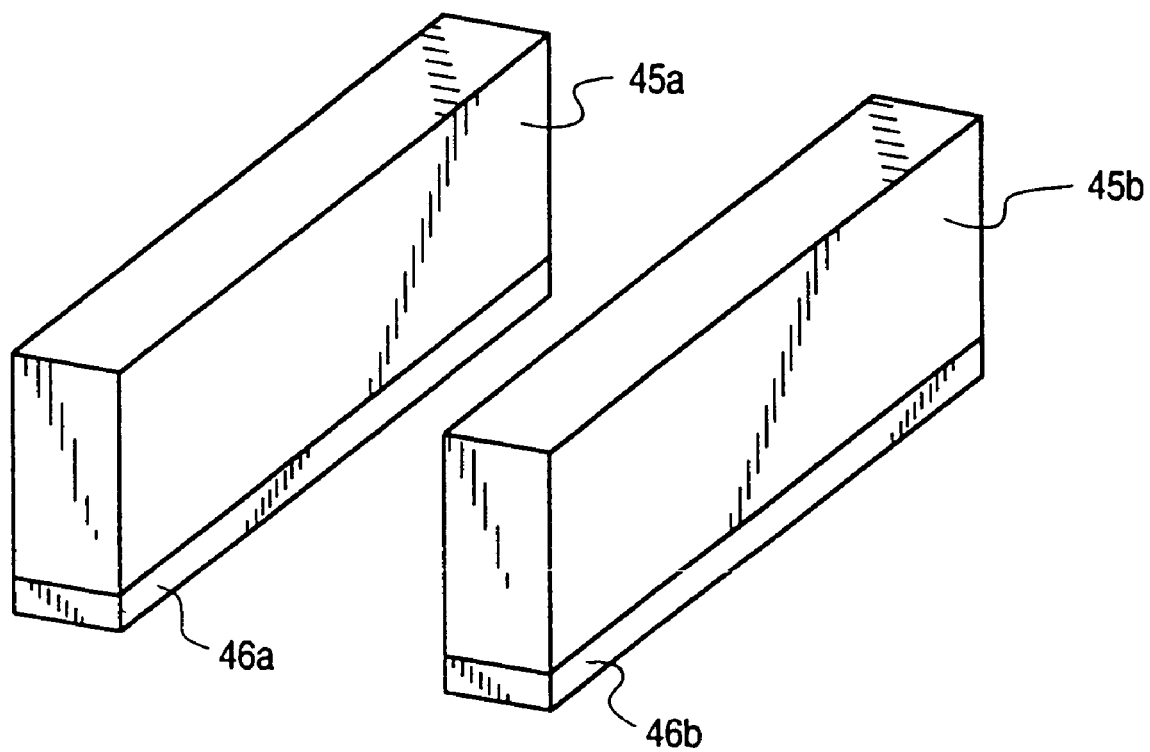
FIG. 12(c) illustrates the structure of FIG. 12(b) after patterning.

Next, the mask which defines the features on the conductors 1 layer is applied, and these features are etched into both the pillar layer stack 45 and the conductors 1 layer 46 below. An insulator is deposited on the wafer and planarized, using CMP or other planarizing technology. FIG. 12(c) shows the wafer at this stage. Note in particular that the pillar layer stack and bottom layer have, been etched into long continuous strips (46a and 45a) and (46b and 45b), not isolated individual pillars. Also note that the edges of the pillar layer stack 45a and 45b are aligned to the edges of the conductor 46a and 46b layer, since both were etched at the same time with the same mask. Note the conductors generally comprise coplanar conductors, such as aluminum or other metals, silicides, or doped silicon conductors, for each level.

While not shown in FIG. 12(c) or the other figures, the dielectric fills the voids between the strips (and pillars) and thus adds support to the array. Also it should be noted that the planarization must reveal the upper surface of the strips so that the conductor layer that follows contacts the strips. The planarized dielectric also forms the layers through which the vias and vertical conductors of FIG. 13 in U.S. Pat. No. 6,034,882 pass.

Figure 12D:
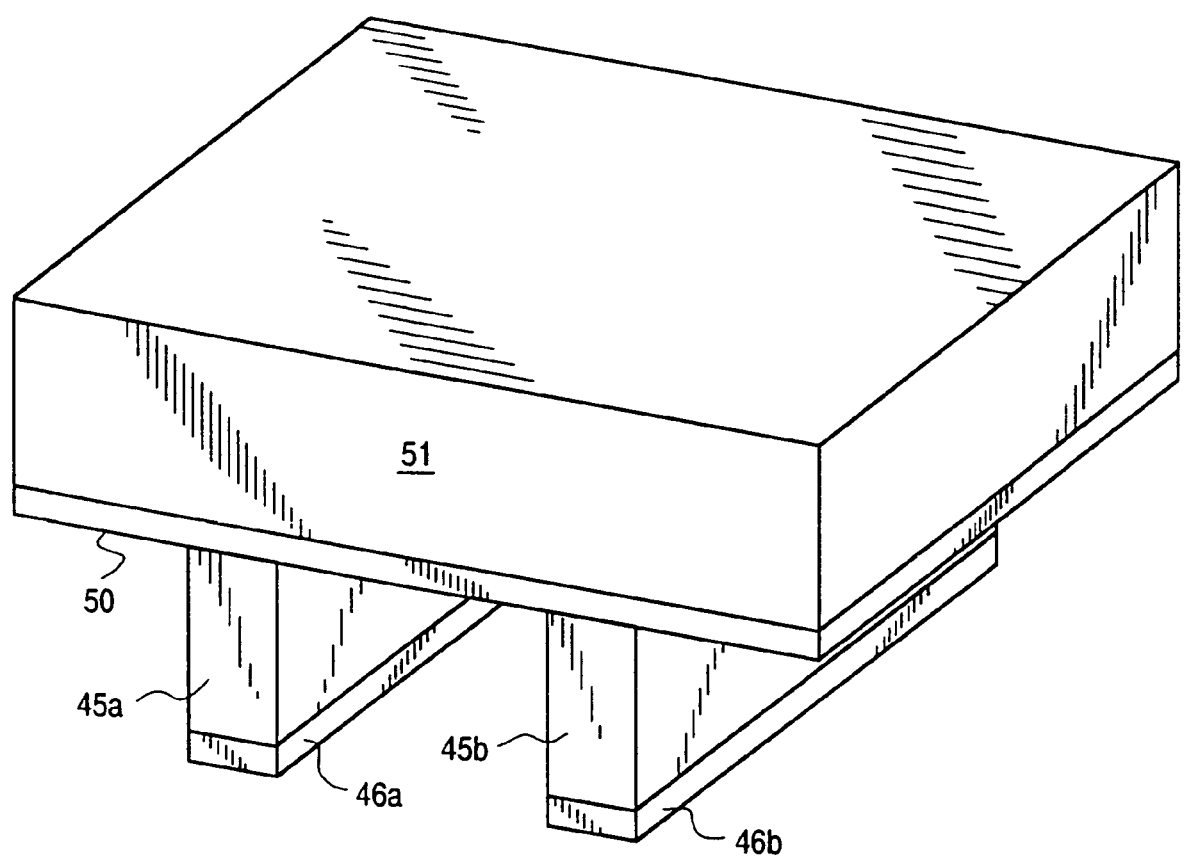
FIG. 12(d) illustrates the structure of FIG. 12(c) after an additional conductor layer and layer stack have been formed.

Next, the second conductor layer 50 ("conductors2") is deposited, and the second pillar stack 51 ("stack2") is deposited. FIG. 12(d) shows the wafer at this stage. Note that the planarization automatically gives a self aligned contact between a pillar layer stack (such as 45b) and the subsequent conductor layer (such as 50) above it.

Figure 12E:
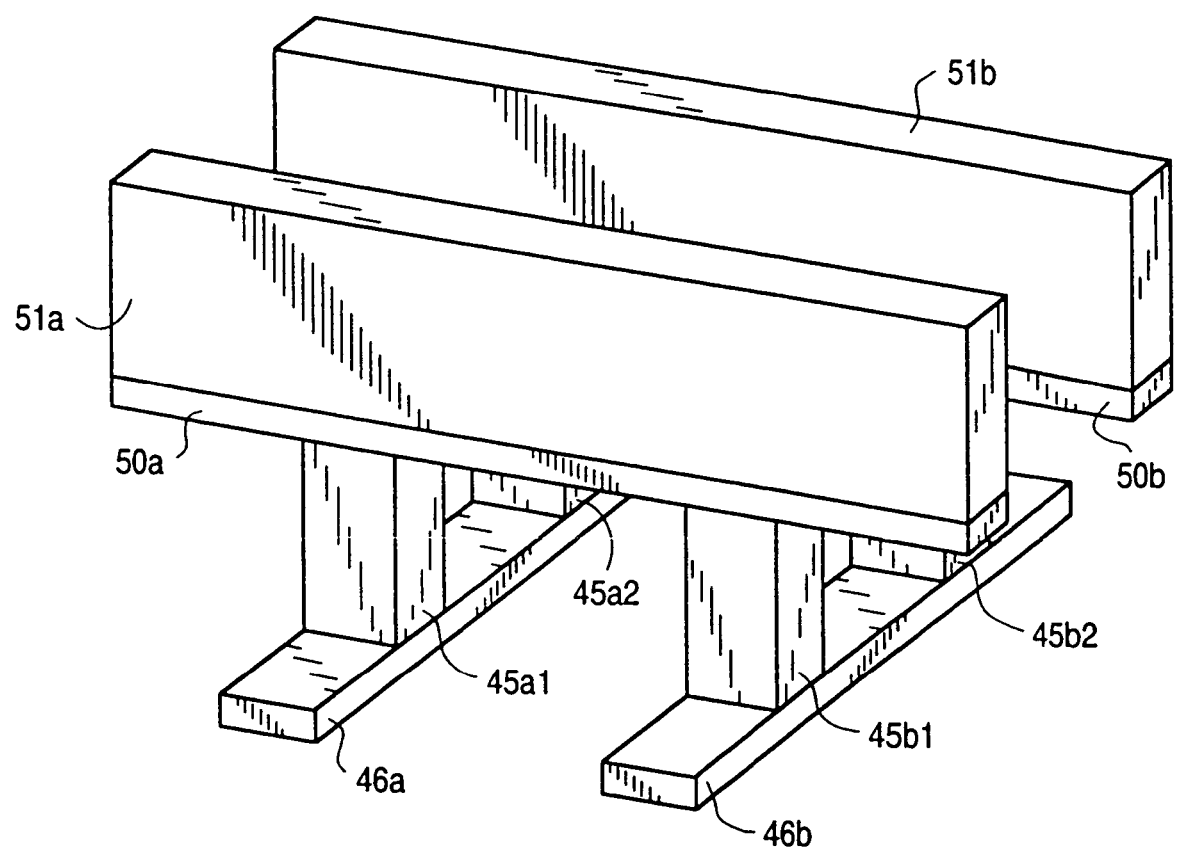
FIG. 12(e) illustrates the structure of FIG. 12(d) after patterning.
Figure 12F:
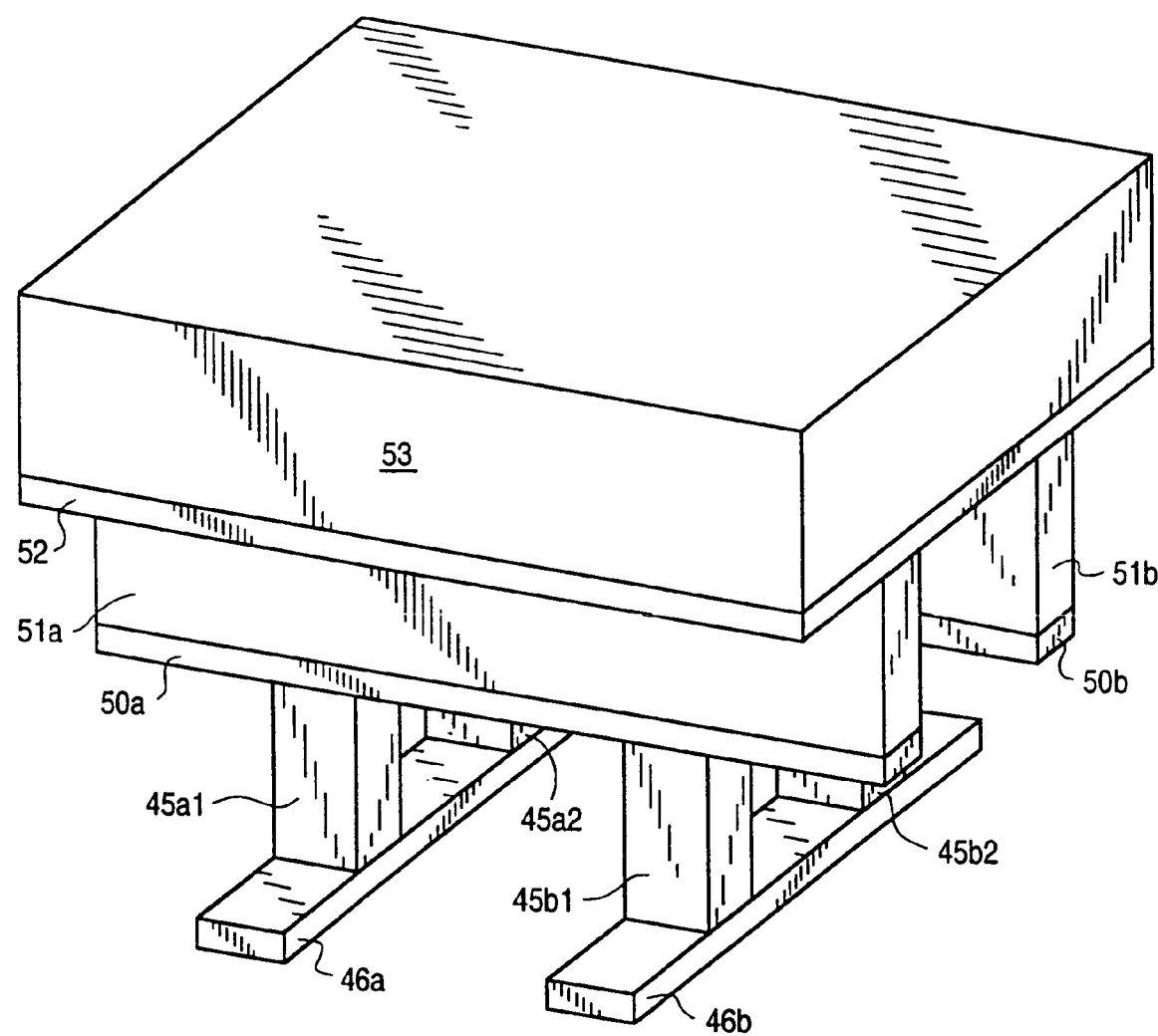
FIG. 12(f) illustrates the structure of FIG. 12(e) after an additional conductor layer and layer stack have been formed.
Figure 12G:
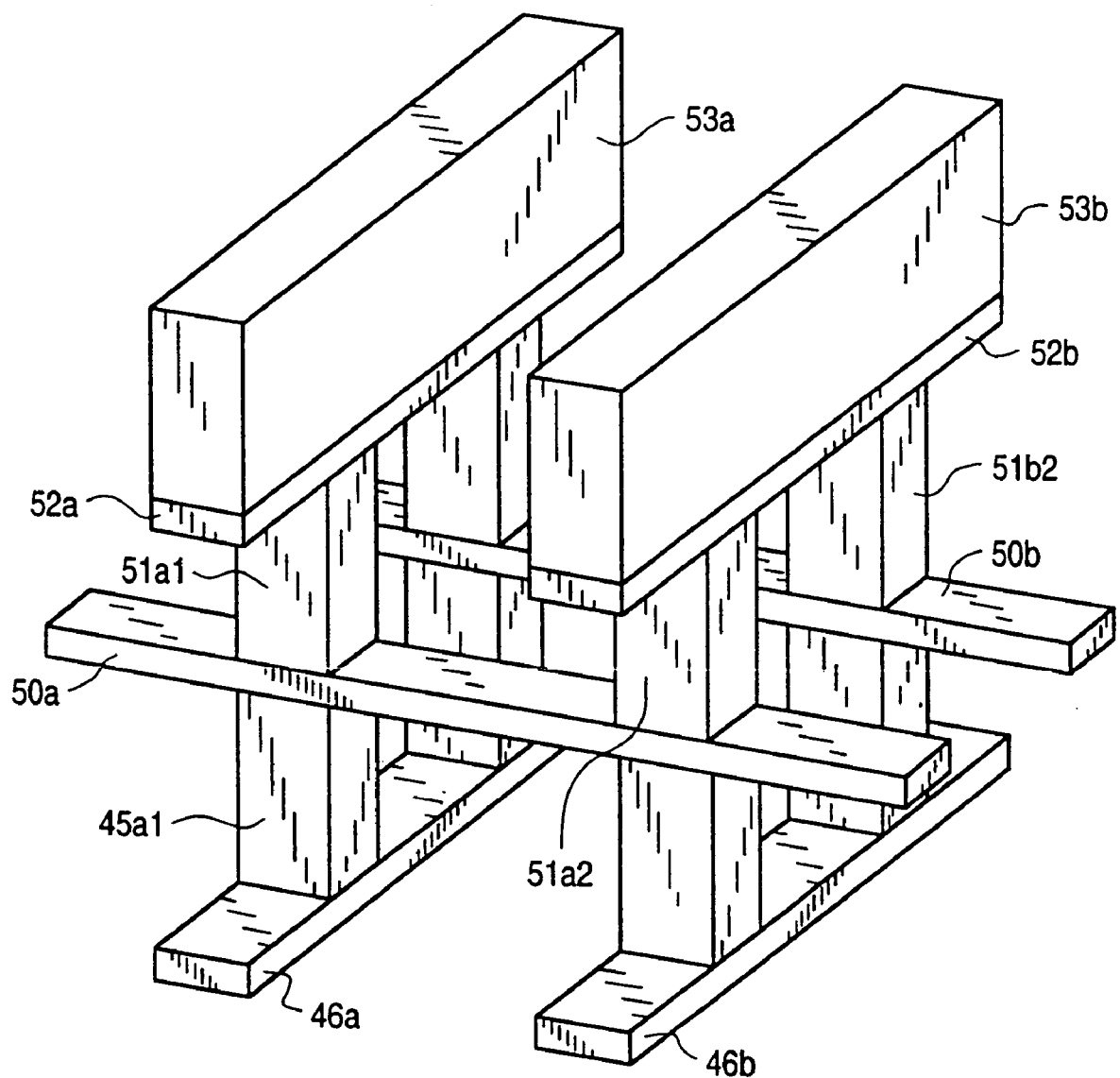
FIG. 12(g) illustrates the structure of FIG. 12(f) after another patterning step.

Now, the conductors2 mask is applied, and its features are etched downward into three distinct strata: pillarstack2 (51), conductors2 layer 50, and pillarstack1 (45a and 45b). (This etch stops below the steering element within 45a and 45b, providing a unique circuit path through the memory cell). An insulator is deposited on the wafer and planarized (using CMP or other means). FIG. 12(e) shows the wafer at this stage. Note that the conductors2 mask+etch has completed the definition of the individual pillars (45a 1, 45a 2, 45b 1 and 45b 2) in the layerstack1. Also note that these pillars in the layerstack1 layer are aligned to both the conductors1 layer (46*a*, 46*b*) and to the conductors2 layer (50*a*, 50*b*), thereby achieving the goal of selfalignment.

Next, the third conductor layer 52 ("conductors3") is deposited, and the third pillar layerstack 53 ("layerstack3") is deposited. FIG. 12(*f*) shows the wafer at this stage.

Now, the conductors3 mask is applied, and its features are etched downwards into layers stack3, conductors3, and stack2. (This etch stops below the steering element of layer stack 2 and is intended to leave the conductor2 layer intact.) An insulator is deposited on the wafer and planarized (using CMP or other means). FIG. 12(*g*) shows the wafer at this stage. The conductors3 mask+etch has completed the definition of the individual pillars in the layerstack2 layer (such as 51*a* 1, 51*a* 2, 51*b* 2). FIG. 12(*g*) shows that (N+1)=3 conductor layers and hence (N+1)=3 masking steps, are required to pattern (N=2) layers of pillar layerstack (not counting the interlevel via layers which are used in the peripheral circuits but not in the memory array). The wafer is now ready to receive more stack layers and conductor layers, at the discretion of the manufacturer.

In one possible embodiment of an array of the invented memory cells the pillars are vertically stacked directly above one another as illustrated in FIG. 12. Note that pillars are lined up in vertically aligned stacks. However, because of selfalignment, this vertical stacking of pillars directly above one another is not a requirement.

Memory cell pillars are automatically formed wherever a conductor on conductor layer (J+1) crosses over a conductor on conductor layer (J). This is true even if the conductor layers are not lined up directly above one another, giving vertical stacks of pillars. In fact it may be preferred that the pillars not be stacked vertically; that is they are offset from one another, as illustrated in FIG. 7 in U.S. Pat. No. 6,034,882. Compare FIG. 5 (vertical stacks of pillars) to FIG. 7 in U.S. Pat. No. 6,034,882 (pillars offset from one another) to see the effect. Offset or staggered pillar placement such as shown in FIG. 7 in U.S. Pat. No. 6,034,882, may be advantageous in practice. It may help give a smoother wafer surface, more suited to planarization and polishing.

In the foregoing sequence of steps, electrode or conductor material is etched along with device material. Since most plasma metal etches also etch polysilicon, a practical combination of materials that enables both dual etching would be aluminum and polysilicon, for example. Control of the etching process may be effected, if desired, through the use of etch chemistries that are selective (e.g., preferentially etching polysilicon, but stopping on aluminum), or through the use of barrier materials that are not etched by the etchants that remove electrode and device material. The state change element may also be used as an etch stop, particularly if it is an oxide rupture type.

Refractory metals such as molybdenum and tungsten are compatible with conventional CVD deposition temperatures for Si and may be used for the conductors. Metal silicides are compatible with even higher temperatures used to activate dopants in Si. Even heavily doped Si itself can be used as a conductor. The choice may be dictated based on resistivity and integration concerns including etch characteristics.

The planarization described after the first half-step of the foregoing is necessary to form self-aligned contacts to the half-etched cells (i.e., the lines running in the east-west direction in the foregoing example). Such planarization may be effected through a variety of means well known in the art, such as chemical-mechanical polishing (CMP), etched-back spin-on dielectric layers, and etched-back spin-on polymers, to cite three well-known examples. To tolerate the possibility of excessive over-polishing or over-etching that may occur during planarization, a second planarization may be performed after deposition of an electrode layer to insure a planar electrode surface for subsequent deposition of device material layers.

The foregoing process sequence exploits self-alignment to reduce the required alignment tolerances between the pillar and the conductors. This embodiment may be substituted with an embodiment involving one or more additional photomasking steps to explicitly define the pillar itself, rather than defining it using the intersection of two conductor photomasking steps, as is done in the self-aligned process. This may be advantageous in various processes that could exploit the explicitly defined sidewalls that would result from such a process. For example, solid-phase crystallization of amorphous silicon could be used to form the steering element layer stack. The free energies of the sidewalls would be expected to favor the formation of a single crystal or grain within the steering element, which may be advantageous in some system embodiments.

Another process that could exploit explicitly defined sidewalls is laser-induced crystallization. Again, the free energies of the sidewalls would be expected to favor the formation of a single crystal or grain within the steering element.

In processes involving the explicit definition of the pillar, a photomasking step would be used to define a bottom conductor. This would be etched. Then, the layer stack required to form the state change and steering elements would be deposited. Another photomasking step would be used to define the pillar, which would be etched. After this etch, an insulating material would be deposited and planarized as in the self-aligned cell, exposing the top of the pillar to form a self-aligned contact. The top conductor would then be deposited and the process would be repeated for subsequent levels of cells as required.

The order of masking steps in the above process could also be reversed. For example, the pillar could be formed prior to patterning the bottom conductor. In this process, the entire layer stack for the bottom conductor, the steering element, and the state change element would be deposited. The pillar would then be lithographically defined and etched down through the steering element. The bottom conductor would then be defined and etched. This structure would be passivated using a planarized insulator contacting scheme, as described above. In all three processes, the self-aligned contact could also be replaced by an explicit contact forming photomasking step.

The various device fabrication steps may result in the presence of residual chemicals or dangling bonds that may degrade device characteristics. In particular, device leakage can result from the presence of such dangling bonds or chemicals (e.g., incompletely removed photoresist). A low-temperature (e.g., <400 C.) plasma oxidation exposure may be used to grow a clean-up oxide on the edges of the device pillar, thereby passivating edge traps. The growth of the oxide is self-limiting because the oxygen species diffuse only slowly through previously grown oxide, resulting in extremely uniform oxide thickness and, therefore, improved manufacturability. (Plasma oxidation may also be used to form an anti-fuse layer.) Oxide deposition may also be used to passivate the surface, for example, either alone or in conjunction with a grown oxide.

Because, in the foregoing for some embodiments, device material (e.g., polysilicon) is deposited after electrode material (e.g., metals), it is desirable to deposit and process the device material at the lowest practical temperatures to widen the selection of suitable metals. As an example, insitu doped polysilicon may be deposited at low temperatures using LPCVD (low pressure chemical vapor deposition), PECVD (plasma-enhanced chemical vapor deposition), PVD (physical vapor deposition), or UHVCVD (ultra high vacuum chemical vapor deposition). An alternative is to deposit undoped polysilicon, followed by doping and activation using a low temperature process. (Traditional activation steps such as long thermal anneals expose the wafer to potentially unacceptably high temperatures.) It may also be desirable in some cases to substitute microcrystalline or amorphous silicon or crystallized amorphous silicon for the polysilicon to enable low temperature fabrication.

Another concern is the possibility of diffusion of electrode material (e.g., metal) into the device layer during processing. Low temperature processing helps to reduce the severity of this problem, but may be insufficient to solve it completely. To prevent this problem, a number of barrier materials may be employed. Examples include titanium nitride (TiN), tantalum (Ta) or tantalum nitride (TaN), among many that are well known to the art.

In one embodiment of the cell, a thin dielectric layer is employed as an antifuse element. In such a cell, good uniformity of dielectric thickness, as well as a low film defect density (e.g., of pinholes in the dielectric) are among highly desirable properties. The quality of the dielectric may be enhanced through a variety of means, such as rotating (continuously or periodically) the substrate and/or source during deposition; forming the dielectric by thermal means using plasmas or low-temperature growth chemistries; or by employing liquid-phase dielectric deposition means.

It is desirable to reduce the number of masking steps that involve critical alignment tolerances. One method for reducing the number of masking steps is to employ vias that interconnect several electrode layers. The vias may be rectangular, rather than square, to allow a relaxation in alignment tolerances. For example, to interconnect metal lines in several layers running in the x-direction, the x-edge via size may be made substantially looser than the pitch of the x-lines in the y-direction, resulting in a rectangular via. Vias are discussed in conjunction with FIGS. 12 and 13 in U.S. Pat. No. 6,034,882.

In summary, a very high density field programmable memory is disclosed. An array is formed vertically above a substrate using several layers, each layer of which includes vertically fabricated memory cells. The cell in an N level array may be formed with N+1 masking steps plus masking steps needed for contacts. Maximum use of self alignment techniques minimizes photolithographic limitations. In one embodiment the peripheral circuits are formed in a silicon substrate and an N level array is fabricated above the substrate.

Rail-Stack Three-Dimensional Memory Devices

Overview of the Structure of the Invented Memory Array

The invented memory array is fabricated on several levels and, for instance, may have eight levels of storage. Each level includes a first plurality of parallel spaced-apart rail-stacks running in a first direction and a second plurality of rail-stacks or conductors (depending on the embodiment) running in a second direction. Generally, the first rail-stacks run perpendicular to the second conductors/rail-stacks and hence form a right angle at their intersections. (In the invented array as well as in the prior art, conductors at one level are shared with the next level, hence the term "level" may not be precisely descriptive.)

The use of rail-stacks is a departure from prior art three-dimensional memories where conductors alone were used in lieu of rail-stacks, and where discrete cells (e.g., pillars) were formed at the intersections of the lines. As will be seen, a bit is stored at each of the intersections of rail-stacks. However, there is no apparent individual memory cell at the intersections, rather memory cells are defined by the rail-stacks and intermediate layers. This makes it easier to fabricate the invented array as will be seen. When the array is fabricated all the bits are in the zero (or one) state and after programming, the programmed bits are in the one (or zero) state.

Figure 13:
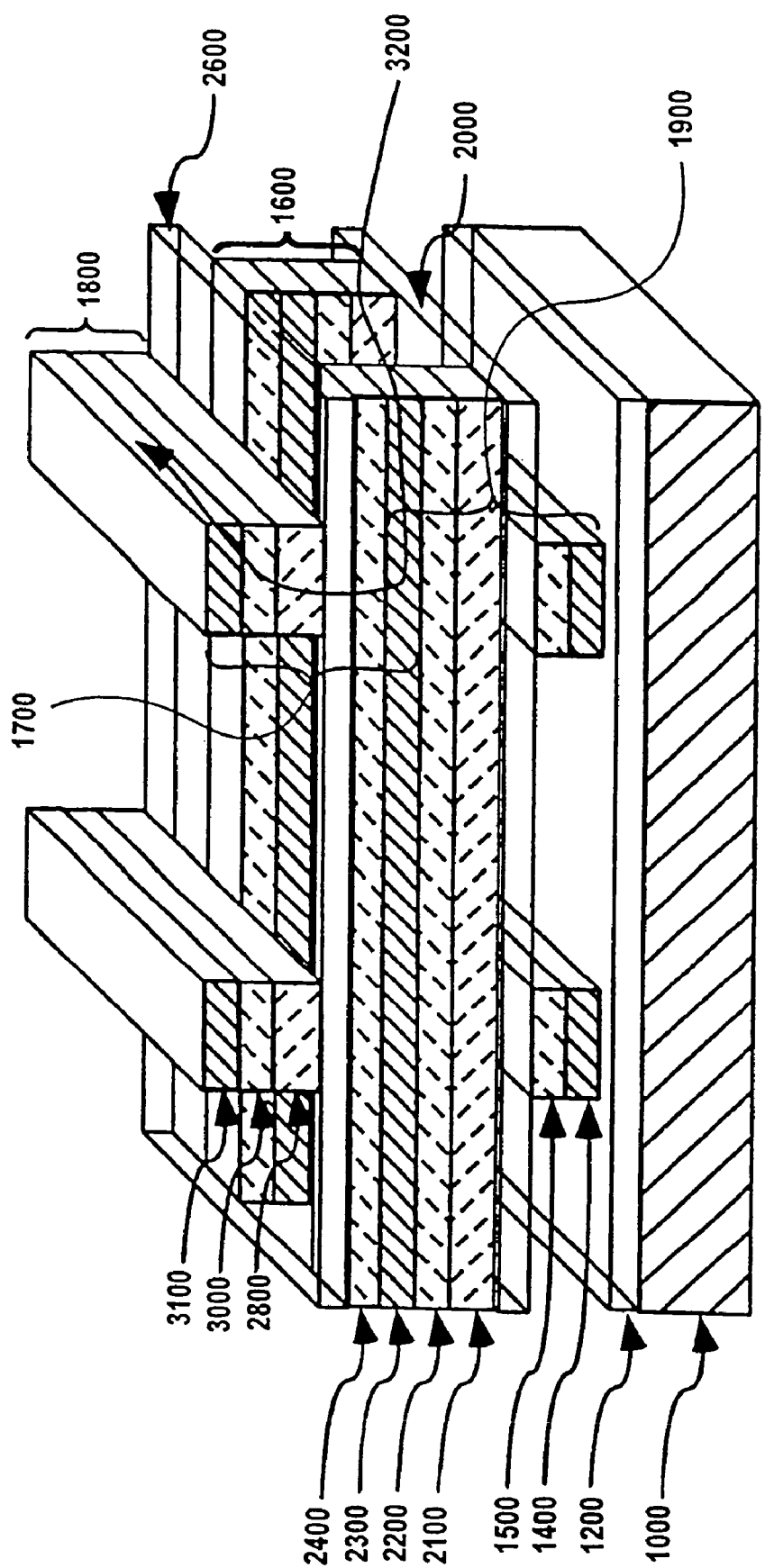
FIG. 13 is a perspective view of a cut-away portion of the invented array.

In the embodiment FIG. 13 several rail-stacks are illustrated in the partial cross-section of the invented array. For instance, rail-stack 1600 is shown at one height and a half rail-stack 1800 is shown at a second height above the first height. Also, half rail-stacks are disposed between rail-stack 1600 and a substrate 1000. These lower rail-stacks run in the same direction as the half rail-stack 1800. A bit is stored at the intersection of rail-stacks and, for instance, a "cell" is present between the rail-stacks and layers shown within the bracket 1700 and another within the bracket 1900. Each of these brackets span a memory level.

The array is fabricated on a substrate 1000 which may be an ordinary monocrystaline silicon substrate. Decoding circuitry, sensing circuits, and programming circuits are fabricated in one embodiment within the substrate 1000 under the memory array using, for instance, ordinary MOS fabrication techniques. (These circuits may also be fabricated above the substrate.) Vias are used to connect conductors within the rail-stacks to the substrates to allow access to each rail-stack in order to program data into the array and to read data from the array. For instance, the circuitry within the substrate 1000 may select rail-stack 1600 and the rail stack 1800 in order to either program or read a bit associated with the intersection of these rail-stacks. (In the case of the embodiments of FIG. 17 some conductors are not part of rail-stacks; these conductors are also coupled to the substrate circuits.)

As shown in FIG. 13, an insulating layer 1200 is formed over the substrate in order that the array may be fabricated above the substrate. This layer may be planarized with, for instance, chemical-mechanical polishing (CMP) to provide a flat surface upon which the array may be fabricated.

Following this, a conductive layer 1400 is formed on the substrate. As will be seen, conductive layers are used within the rail-stacks and these layers and the resultant conductors may be fabricated from elemental metals such as tungsten, tantalum, aluminum, copper or metal alloys may be used such as MoW. Metal silicides may also be used such as TiSi2, CoSi2 or a conductive compound such as TiN, WC may be used. A highly doped semiconductor layer such as silicon is also suitable. Multiple layer structures may be used selecting one or more of the above.

Following the deposition of a conductive layer, a layer of semiconductor material (layer 1500) such as silicon is formed over the conductive layer. This is typically a polysilicon layer, however, an amorphous layer may be used. Other semiconductor materials may be used such as Ge, GaAs, etc. In the embodiment of FIG. 13 this semiconductor layer is highly doped and, as will be seen, forms one-half a diode. After masking and etching steps, half rail-stacks are formed. These rail-stacks are "half" or partial rail-stacks since they are approximately half the thickness of the rail-stacks used in the next level.

Following this, in the embodiment of FIG. 13, a material for the antifuses used to program the array is deposited. In one embodiment, the layer 2000 is a dielectric such as silicon dioxide which is deposited by chemical vapor deposition (CVD) in a blanket deposition over the half rail-stacks and a dielectric fill, filling the space between the rail-stacks. In another embodiment the layer 2000 is grown on the upper surface of the silicon layer 1500 and only exists on the rail-stacks.

Now a full set of memory array rail-stacks is formed on the layer 2000. This comprises first the deposition of a lightly doped silicon layer 2100 doped with a conductivity type dopant opposite to that used for the silicon layer 1500, a heavily doped silicon layer 2200 doped also opposite to the layer 1500, a conductive layer 2300 and a heavily doped silicon layer 2400 doped with the same conductivity type dopant as layers 2100 and 2200. After masking and etching, the rail-stacks shown in FIG. 13, such as rail-stack 1600 are formed. These rail-stacks are, as illustrated, in a direction perpendicular to the rail-stacks above and below them.

While not shown in FIG. 13 but as will be described later, the spaces between the rail-stacks after they are defined, are filled with a dielectric such as silicon dioxide. Then the rail-stacks and fill are planarized by CMP. In another embodiment spin-on-glass (SOG) is used to fill the voids, in this case chemical planarization can be used, for example, plasma etching. Other fill and planarization methods can be used.

After formation of the rail-stacks another antifuse layer 2600 is formed, for instance, from a dielectric such as silicon dioxide, silicon nitride, silicon oxynitride, amorphous carbon or other insulating materials or combinations of materials. (Also an updoped layer of silicon may be used for the antifuse layer.)

Now another layer of rail-stacks are defined and only half rail-stacks are shown in FIG. 13 at this upper level. This half rail-stack comprises a silicon layer 2800 doped with a conductivity type dopant opposite to that of layer 2400. This is a lightly doped layer. Another silicon layer 3000 is formed on layer 2800 and this layer is doped with the same conductivity type dopant as layer 2800, however, it is more heavily doped. Then a conductive layer 3100 is formed above the layer 3000.

Half rail-stacks are used at the very upper-most level of the array and at the very lowest level of the array. In between the half rail-stacks the full rail-stacks, such as rail-stack 1600, are used throughout the array.

It should be noted that the silicon layers disposed on the conductive layers extend the entire length of the rail-stacks in the embodiment of FIG. 13 and are uninterrupted except possibly where vias are used to provide a conductive path to the substrate 1000.

In FIG. 13 a path 3200 is illustrated from a lower conductor in level 1700 to an upper conductor in this level found in the rail-stack 1800. This path is accessed in one embodiment through decoding circuitry in the substrate for both programming and reading of data into and from the array for one bit.

For instance, to program the bit, a relatively high voltage, 5–20V is applied between the conductors generally so as to forward-bias the "diode" between these conductors. This relatively high voltage causes a breach in the layer 2600 creating a diode. Without this high voltage, the layer 2600 remains an insulator. Thus, by selecting pairs of conductors, diodes can be selectively formed so as to program the array. While programming the array with the layers adjacent to the antifuse material being forward-biased is currently preferred, it is also possible to program using a reverse-biasing potential.

To sense the data programmed into the array, a voltage lower than that for programming is used. This voltage is applied so as to forward-bias the diode of the cell being accessed and thus allowing a sense amplifier to determine whether or not the layer 2600 is intact between the rail-stacks. Note that "sneak" or parasitic paths in the array which would interfere with the sensing will include a reverse-biased diode.

Also as will be described later, the "anode" and "cathode" of the diodes are reversed at each of the successive antifuse layers. This facilitates easier programming and sensing since all of its conductors at each level are either bit lines or word lines. And, for instance, conductors at one height will serve as bit lines for two levels and conductors at the next height serve as word lines for two levels. This simplifies the decoding and sensing and more importantly reduces processing.

Figure 15:
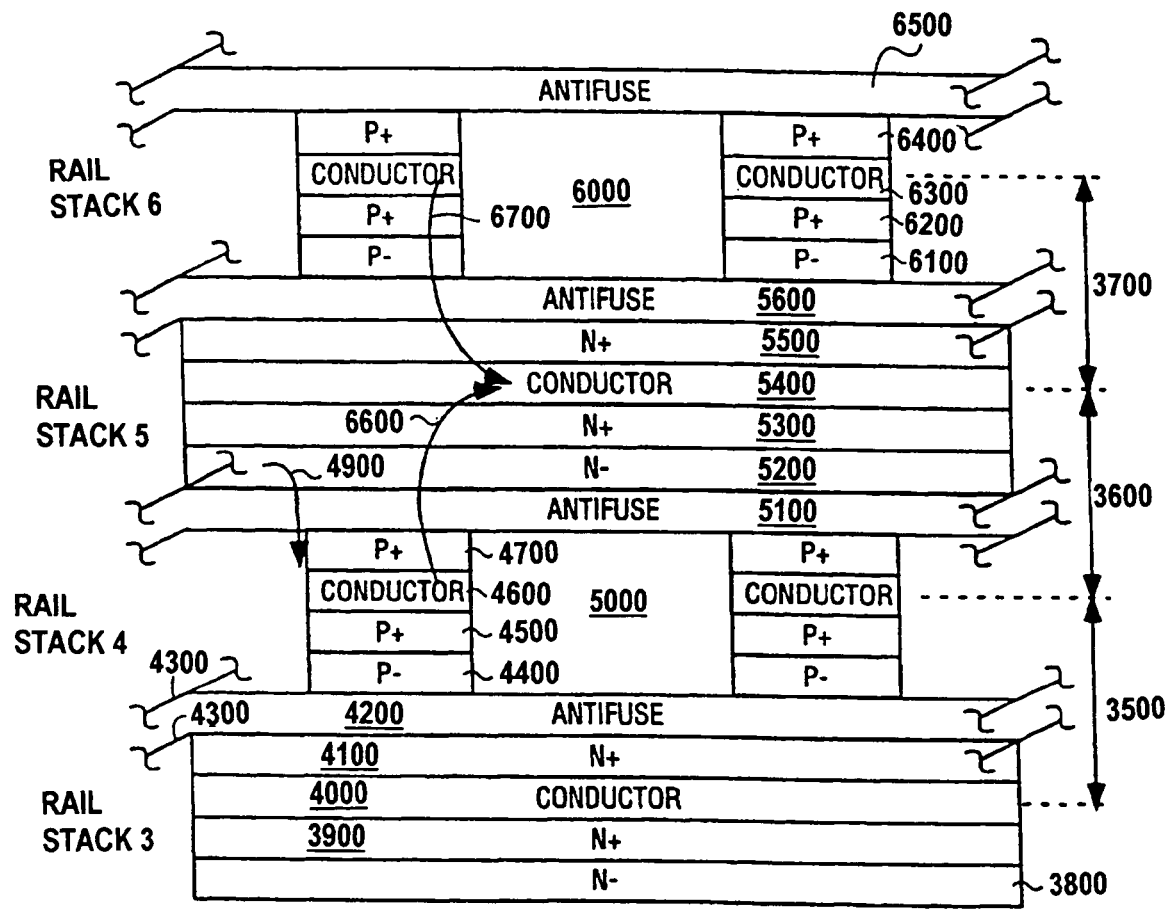
FIG. 15 is a cross-sectional elevation view of one embodiment of the present invented array.

Embodiment of FIG. 15

In the cross-section elevation view of FIG. 15, one embodiment is illustrated which corresponds to the embodiment shown in FIG. 13. In FIG. 15 the half rail-stacks of FIG. 13 are not illustrated. Three complete levels 3500, 3600 and 3700 of the array are illustrated in FIG. 15. Below layer 3800 of FIG. 15 other rail-stacks or half rail-stack are used. Also above layer 6500, a full or half rail-stack is used.

The rail-stack 3 comprising layers 3800 through 4100 includes a lightly doped n– layer 3800, a heavily doped n+ layer 3900, a conductor layer 4000 and n+layer 4100. The fabrication of these rail-stacks will be discussed in more detail in conjunction with FIG. 14A through FIG. 14G. An antifuse layer 4200 which for the embodiment of FIG. 15 is a blanket deposition covers all of the rail-stacks formed below layer 4200 as well as the fill filling the voids between the rails. As mentioned, the layer 4200 is a deposited silicon dioxide layer in one embodiment.

It should be noted that n+ layers sandwich the conductor layer 4000. These highly doped layers provide ohmic transitions to prevent unintended Schotky formation.

The layers above and below conductor 4000 are not symmetrical for the embodiment illustrated in that an n– layer 3800 is used below the conductor 4000 and not above the conductor 4000. Only a single lightly doped layer (in conjunction with a heavily doped layer) is needed to define a diode; the thickness of this lightly doped layer is important in controlling the break-down voltage and resistance of the diode so formed. The layer 4100, a heavily doped semiconductor layer, and the fill are planarized after the rail-stacks are defined and then a blanket deposition of the antifuse layer 4200 is formed on the layer 4100. (The lines 4300 in FIG. 15 are used to indicate that the antifuse layer 4200 and like layers are not etched with the rail-stack below it and thus extend over the entire array for the illustrated embodiment.)

One advantage to the layer 4200 and the other like layers in the structure, such as layers 5100, 5600 and 6500, is that since they are an unbroken deposition, sidewall leakage (into the rail-stacks below) will be minimized, limiting electrical problems during reading and writing. When subsequent conductive material is deposited, it is unable to reach the sides of the rail-stacks below it because of this blanket deposition of the antifuse layer. For instance, path 4900 which would allow silicon from layer 5200 to cause a parasitic path does not exist because of the unbroken blanket deposition of the antifuse layer 5100.

Rail-stacks 4 comprising layers 4400, 4500, 4600 and 4700 are formed on the antifuse layer 4200. Layer 4400 is lightly doped with a p-type dopant for the embodiment illustrated followed by a p+ layer 4500, a conductive layer 4600 and a p+ layer 4700. After these layers are deposited, they are masked and etched to define the rail-stacks. Then the voids between these rail-stacks, such as void 5000, are filled with a dielectric. The fill dielectric is planarized along with a portion of p+ layer 4700. Planarization is done at this point in the fabrication since there is generally poor control over the thickness and contour of the fill. The fill tends to build up on the rail-stacks when a non-spin-on deposition is used. This is followed by a blanket deposition of layer 5400.

The process is now repeated this time beginning with an n− layer 5200 followed by an n+ layer 5300, a conductive layer 5400 and n+ layer 5500. Again after defining the rail-stacks 5, the voids are filled and the surface is planarized. Another antifuse layer 5600 is deposited. The process is repeated for the rail-stacks 6 this time beginning with a p− layer 6100, p+ layer 6200, conductive layer 6300, p+ layer 6400. Again after defining the rail-stacks, filling the void 6000 and then planarizing, another antifuse layer 6500 is deposited.

As shown by the path 6600, when a large enough voltage is applied between conductors 4600 and 5400 the antifuse layer 5100, at the intersection of layers 4700 and 5200 is breached creating a diode at the intersection. As mentioned, this is selectively done throughout the array to program the array. The conductor 5400 is therefore a bit line for the "cells" above and below it, for instance path 6700 indicates another possible current path for another "cell" where the conductor 5400 is again a bit line during sensing.

It should be noted that with the reversal of the p− and n− layers at each successive rail-stack, planarization always occurs on a heavily doped layer such as layer 4700 and layer 5500. Moreover, the lightly doped layers are always formed on relatively planar surfaces, consequently their thickness can be more easily controlled. This, as mentioned, allows the characteristics of the diode (once the intermediate antifuse layer is breached) to be more reliably controlled.

Processing Flow for the Embodiment of FIG. 15

The process flow for forming rail-stack 5 of FIG. 15 is illustrated in FIGS. 14A–14H. It will be apparent that the rail-stacks for the other embodiment (FIGS. 16 and 17) are similarly processed.

Figure 14A:
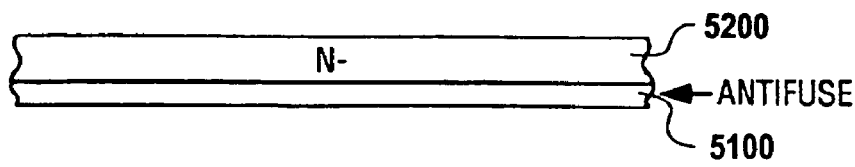
FIGS. 14A–14H illustrate some of the steps used to fabricate one embodiment of the invented memory.

First, as shown in FIG. 14A an antifuse layer 5100 is deposited. This typically is 50–200 Å of silicon dioxide which can be deposited with any one of very well-known processes. Following this, a silicon layer 5200 is deposited which is typically 1000–4000 Å thick and formed with a CVD process where a phosphorous dopant is deposited along with the deposition of for instance, the polysilicon semiconductor material or where the dopant is ion implanted following the deposition of the layer. This layer is doped to a level of $5 \times 10^{16} - 10^{18}/cm^3$.

Figure 14B:
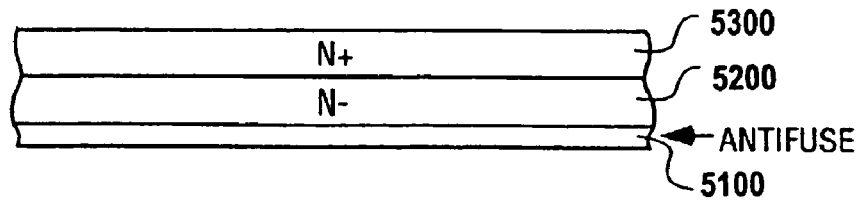
Figure 14C:
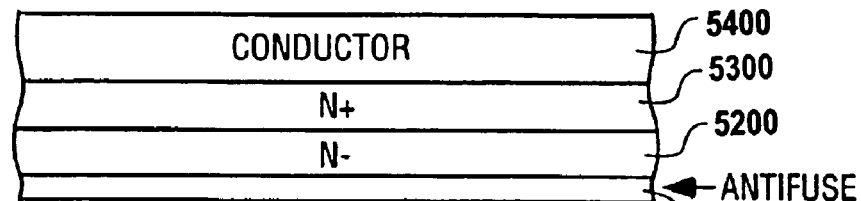
Figure 14D:
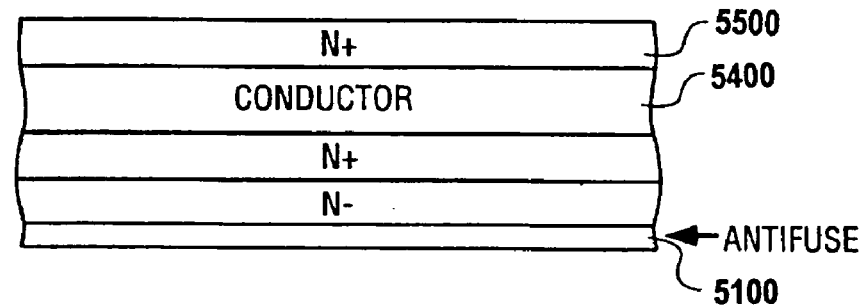

Now, as shown in FIG. 14B an n+ layer 5300 is deposited again using CVD. This layer may be approximately 300–3000 Å thick and in one embodiment is doped to a level of $>10^{19}/cm^3$.

Throughout this application two adjacent silicon layers are often shown such as layers 5200 and 5300, with different doping. These layers may be formed with one deposition and then using ion implantation step at two different energy levels to obtain the two doping levels.

A conductive layer which may be 500–1500 Å thick is formed using any one of numerous well-known thin film deposition process such as sputtering. A refractory metal may be used or a silicide of a refractory metal. Also as mentioned aluminum or copper can be used, or more simply the heavily doped silicon can be the conductor.

Next another semiconductor layer of, for instance, polysilicon approximately 1500–2000 Å thick is formed again doped to a level of $>10^{19}/cm^3$. This is shown as layer 5500 in FIG. 14D; after planarization its thickness is between 300 Å and 2000 Å thick.

Figure 14E:
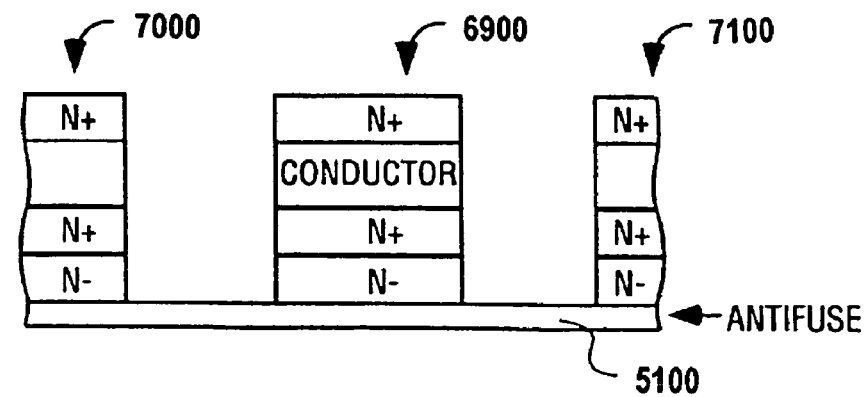

A masking and etching step is now used to define rail-stacks, such as rail-stacks 6900, 7000 and 7100 shown in FIG. 14E. Note that when comparing this view to the view of rail-stack 5 of FIG. 15, the view in FIG. 14E is taken from the side and consequently shows the individual rail-stacks. An ordinary masking and etching step for instance using plasma etching, may be used. Etchants can be used that stop on the antifuse layer thus preventing this layer from being etched away. Thus, layer 5100 can be considered an etchant stop layer depending on the specific etchants used.

Figure 14F:
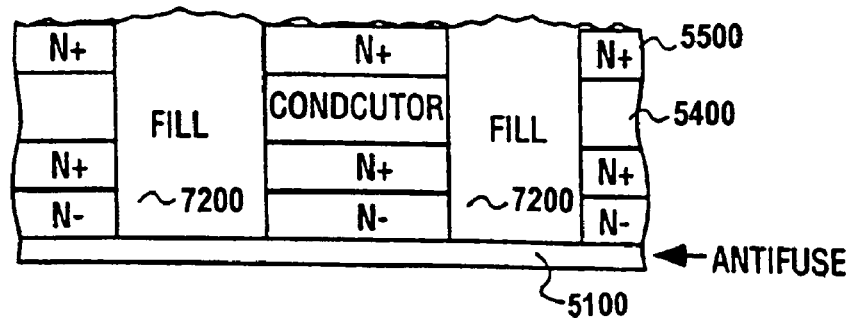
Figure 14G:
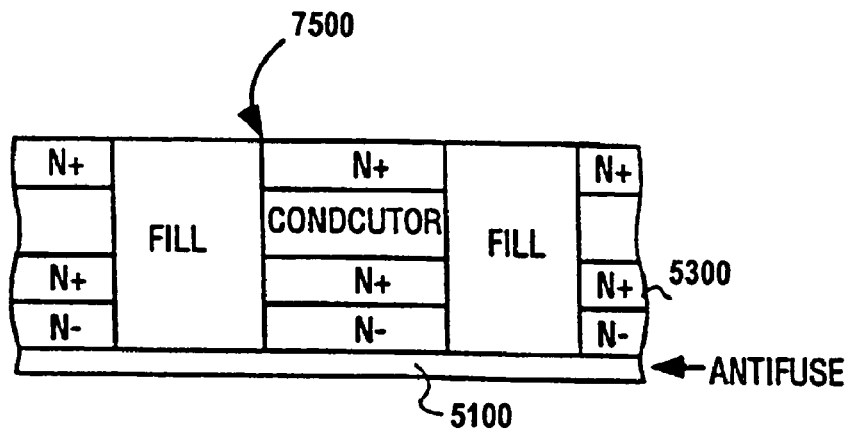

Now as shown in FIG. 14F, the spaces between the rail-stacks are filled with a dielectric such as formed with a HDPCVD process.

Chemical-mechanical polishing is then employed to planarize the upper surface of the rail-stacks shown in FIG. 14F in one embodiment. Chemical etching can also be used as mentioned with certain dielectrics. This planarization can reduce the thickness of the layer 5500 to approximately 500 Å, thus this layer ends up being of approximately the same thickness as the layer 5300.

Figure 14H:
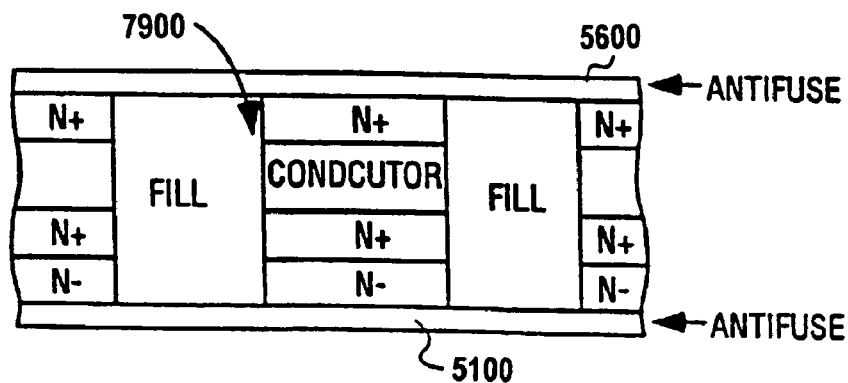

Next as shown in FIG. 14H another antifuse layer 5600 is formed on the planarized surface 7500. Since the layer 5600 is deposited over all the rail-stacks and the filler material and remains unetched, it forms a barrier to the migration of the materials subsequently deposited that might make their way along the sides of the rail-stacks such as along path 7900. Thus the layer 5600 helps prevent the parasitic paths and potential shorts that may occur with prior art memories.

It should be noted that in FIG. 15 while the antifuse layer is shown as a blanket layer covering the rail-stacks and fill, it is possible also to fabricate each level where the antifuse layer is in fact grown from a semiconductor layer. For instance, an oxidation step may be used to grow a silicon dioxide layer from layers 4100, 4700, 5500 and 6400. This grown layer would then be in lieu of the antifuse layers shown in FIG. 15.

Figure 16:
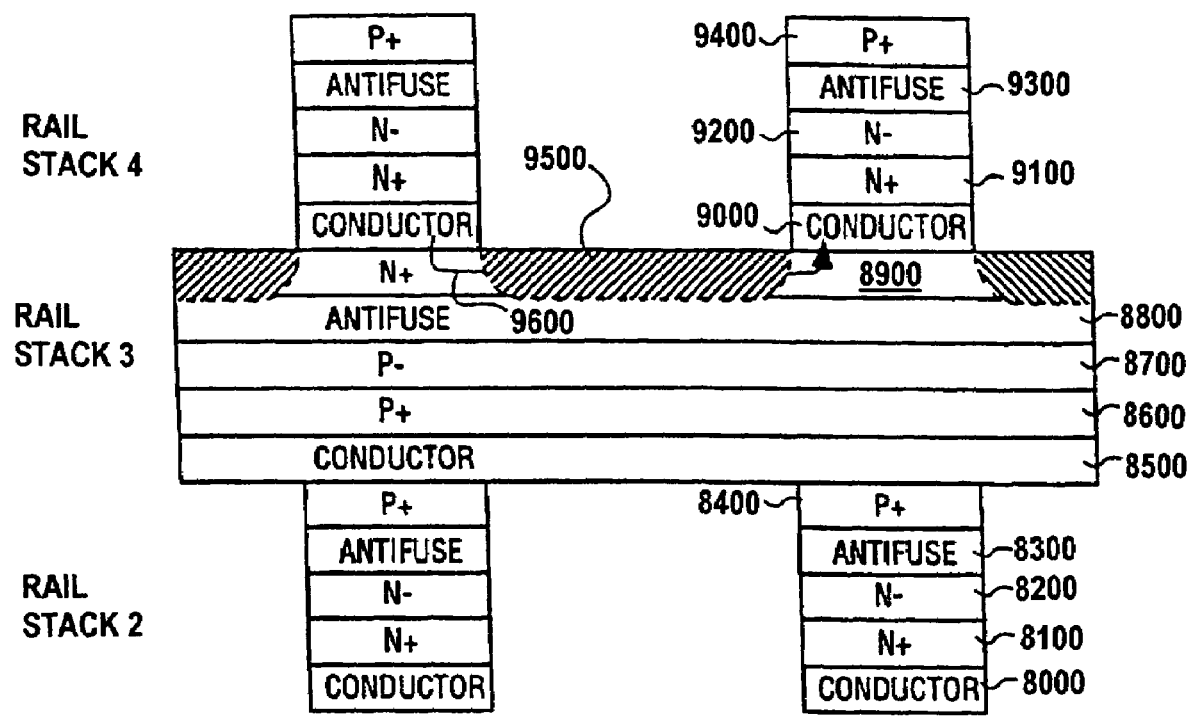
FIG. 16 is a cross-sectional elevation view of a second embodiment of the invented array.

The Embodiment of FIG. 16

For the embodiment of FIG. 16 each rail-stack begins with a conductor such as layer 8000 of FIG. 16. An n+ semiconductor layer 8100 and an n− layer 8200 are formed on layer 8000. Next a layer of antifuse material 8300 is formed. Then a p+ layer 8400 of semiconductor material is deposited (e.g., silicon with boron dopant) on the antifuse. When the rail-stacks are formed, for instance for rail-stack 200 of FIG. 16, the antifuse layer 8300 is etched as well as layers 8000, 8100, 8200 and 8400.

The voids between the rail stacks are now filled and planarization is done, planarizing the fill with the upper surface of the layer 8400. Following the completion of the rail-stack 2 the next rail-stacks are formed shown as rail-stacks 3 in FIG. 16. This comprises a conductor layer 8500, p+ layer 8600, p− layer 8700, antifuse layer 8800 and n+ layer 8900. Again masking and etching occur. This etching also etches the exposed regions of layer 8400 which does not appear in the view of FIG. 16, but this will be apparent shortly when region 9500 of the next stack is discussed. Now filling and planarization occurs and the next layer of rail-stacks are formed shown as rail-stack 400. As illustrated, this comprises a conductive layer 9000, n+ layer 9100, n− layer 9200, antifuse layer 9300, and p+ layer 9400. Once again masking, etching, filling and planarization occur.

Unlike the embodiment of FIG. 15, when rail-stacks at any particular height are formed, etching must occur on one layer of the rail-stack immediately below the rail-stack being defined. For instance, when rail-stack 4 is etched the layer 8900 of rail-stack 3 is etched away where it is not covered by rail-stack 4 as shown by region 9500. This etching is used to remove all of the semiconductor material between the adjacent conductors and consequently prevent a path, such as path 9600 shown in FIG. 16. This etching also occurs to layer 8400 which, as mentioned, is not seen in FIG. 16. In this connection the antifuse layer 8800 can be used as an etchant stop, although this is not necessary. No harm is done if etching does occur through the layer 8800 since the antifuse layer is only needed at the intersections of the rail-stacks. Note the etching of the region 9500 is done in alignment with overlying rail-stacks and consequently no additional masking is required.

As was the case with the earlier embodiment, the order of the n and p doped layers alternate with each successive rail-stack. Moreover, the rail-stacks at any given height include both p and n layers. In contrast, for the embodiment of FIG. 15, at any particular height, the rail-stacks are doped with either an n type or p type dopant but not both.

Figure 17:
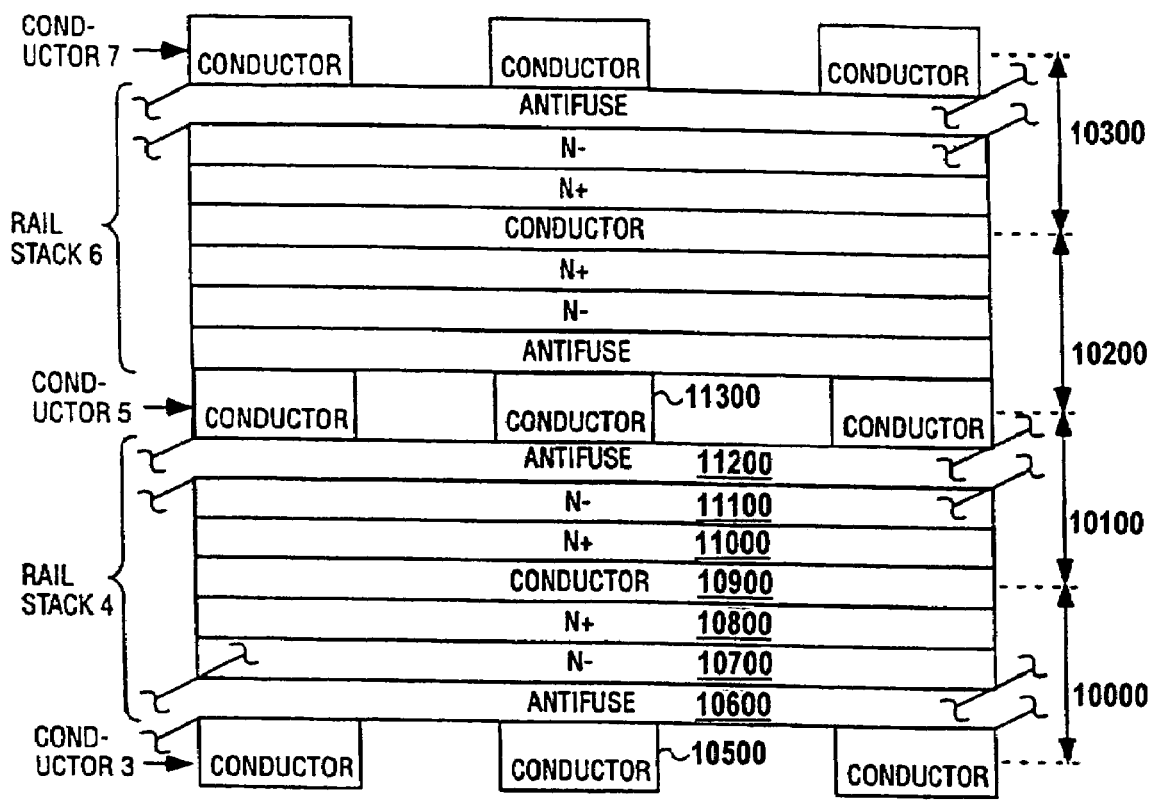
FIG. 17 is a cross-sectional elevation view of a third embodiment of the invented array.

Embodiment of FIG. 17

In the embodiment of FIG. 17, alternate levels of rail-stacks running in a first direction and intermediate layers of conductors are running in a second direction are used. For instance as shown in FIG. 17, the conductors 3, 5 and 7 run in a first direction whereas the rail-stacks 4 and 6 run in a second direction.

In this embodiment each of the rail-stacks is symmetrical about a conductor such as conductor 10900 of rail-stack 4. The conductor is sandwiched between two n+ layers 10800 and 11000. More lightly doped outer layers 10700 and 11100 are disposed on these more heavily doped layers.

In fabrication the conductors such as conductors 10500, are first formed, for instance, on the substrate. The spaces between these conductors may be filled and planarization may occur. Then an antifuse layer 10600, n− layer 10700, n+ layer 10800, conductive layer 10900, n+ layer 11000 and n− layer 11100 are deposited. Rail-stacks are then defined by masking and etching. The voids between the rail-stacks are then filled with a dielectric. Then planarization of the filling material and the upper surface of layer 11100 is performed. Following this, antifuse layer 11200 is deposited over the entire array. Now additional conductors are formed such as conductors 11300. Each level in this array is between a metallic conductor such as conductor 10500, and a sandwich conductor such as conductor 10900. Thus there are four memory levels shown in FIG. 17, levels 10000, 10100, 10200 and 10300.

Programming in this array causes the formation of Schottky diodes consequently, the conductors such as conductors 10500 and 11300 must be of a suitable material to allow formation of a Schottky diode. For instance, aluminum and some refractory metal or silicides may be used.

Other Embodiments

In the above description a conductor is shared by two levels. An array may be fabricated where there are two conductors for each level that are not shared with other levels. A dielectric may be used to separate each such level. Also while above diodes on alternate levels "point" in the same direction, this is not necessary. For instance, a shared conductor may have diodes point-in from above and point-out from below. This requires different driving circuitry in the substrate.

In summary, a multi-level memory array is described employing rail-stacks. The rail-stacks include a conductor and semiconductor layers. The rail-stacks are generally separated by an insulating layer used to form antifuses. In one embodiment, one-half the diode is located in one rail-stack and the other half in the other rail-stack.

The forgoing detailed description has described only a few of the many possible implementations of the present invention. For this reason, this detailed description is intended by way of illustration, and not by way of limitation. It is only the following claims, including all equivalents, that are intended to define the scope of this invention.

What is claimed is:

1. A three-dimensional memory device with ECC circuitry comprising:
   a support element;
   error checking and correcting (ECC) circuitry carried by the support element; and
   a memory array carried by the support element, wherein the memory array comprises:
      a first conductor;
      a first memory cell above the first conductor;
      a second conductor above the first memory cell; and
      a second memory cell above the second conductor, wherein the first memory cell, second memory cell, and second conductor are all in a plane defined by the second conductor;
      wherein the second conductor is the only conductor between the first and second memory cells in the plane.

2. The invention of claim 1 further comprising a housing protecting the error checking and correcting (ECC) circuitry and the memory array.

3. The invention of claim 1, wherein the memory cells comprise write-once memory cells.

4. The invention of claim 1, wherein the memory cells are selected from the group consisting of semiconductor-transistor-technology-based memory cells, magnetic-based memory cells, and organic-electronics-based memory cells.

5. A method for storing data and error checking and correcting (ECC) bits in a three-dimensional memory device with ECC circuitry, the method comprising:
   (a) with a three-dimensional memory device comprising:
      a support element;
      error checking and correcting (ECC) circuitry carried by the support element; and
      a memory array carried by the support element, wherein the memory array comprises:
         a first conductor;
         a first memory cell above the first conductor;
         a second conductor above the first memory cell; and
         a second memory cell above the second conductor, wherein the first memory cell, second memory cell, and second conductor are all in a plane defined by the second conductor;
         wherein the second conductor is the only conductor between the first and second memory cells in the plane;
   receiving at least one data bit to be stored in the memory array;
   (b) with the ECC circuitry, generating at least one ECC bit based on the at least one data bit; and
   (c) storing the at least one data bit and the at least one ECC bit in the memory array.

6. The invention of claim 5 further comprising:
(d) retrieving the at least one data bit and the at least one ECC bit in the memory array; and
(e) with the ECC circuitry, identifying an error in the retrieved at least one data bit and at least one ECC bit.

7. The invention of claim 5, wherein the memory device further comprises a housing protecting the error checking and correcting (ECC) circuitry and the memory array.

8. The invention of claim 5, wherein the memory cells comprise write-once memory cells.

9. The invention of claim 5, wherein the memory cells are selected from the group consisting of semiconductor-transistor-technology-based memory cells, magnetic-based memory cells, and organic-electronics-based memory cells.

10. The invention of claim 1, wherein the first memory cell is horizontally displaced from the second memory cell.

11. The invention of claim 1, wherein the first memory cell is not horizontally displaced from the second memory cell.

12. The invention of claim 5, wherein the first memory cell is horizontally displaced from the second memory cell.

13. The invention of claim 5, wherein the first memory cell is not horizontally displaced from the second memory cell.

* * * * *